(12) United States Patent
Kim

(10) Patent No.: US 10,431,594 B2
(45) Date of Patent: Oct. 1, 2019

(54) SEMICONDUCTOR DEVICE AND METHOD OF MANUFACTURING THE SAME

(71) Applicant: SK hynix Inc., Icheon-si Gyeonggi-do (KR)

(72) Inventor: Do Youn Kim, Icheon-si (KR)

(73) Assignee: SK hynix Inc., Icheon-si Gyeonggi-do (KR)

( * ) Notice: Subject to any disclaimer, the term of this patent is extended or adjusted under 35 U.S.C. 154(b) by 0 days.

(21) Appl. No.: 15/870,038

(22) Filed: Jan. 12, 2018

(65) Prior Publication Data

US 2019/0019806 A1 Jan. 17, 2019

(30) Foreign Application Priority Data

Jul. 11, 2017 (KR) .................. 10-2017-0087866

(51) Int. Cl.
| | |
|---|---|
| H01L 29/76 | (2006.01) |
| H01L 27/11582 | (2017.01) |
| H01L 21/768 | (2006.01) |
| H01L 21/762 | (2006.01) |
| H01L 27/11565 | (2017.01) |
| H01L 21/033 | (2006.01) |
| H01L 21/311 | (2006.01) |
| H01L 27/1157 | (2017.01) |

(52) U.S. Cl.
CPC .... *H01L 27/11582* (2013.01); *H01L 21/0332* (2013.01); *H01L 21/0335* (2013.01); *H01L 21/0337* (2013.01); *H01L 21/31144* (2013.01); *H01L 21/76224* (2013.01); *H01L 21/76816* (2013.01); *H01L 21/76844* (2013.01); *H01L 27/1157* (2013.01); *H01L 27/11565* (2013.01)

(58) Field of Classification Search
CPC .................. H01L 27/11551–11556; H01L 27/11578–11582; H01L 27/2481
See application file for complete search history.

(56) References Cited

U.S. PATENT DOCUMENTS

| | | | |
|---|---|---|---|
| 9,786,673 B1 * | 10/2017 | Cho | ............... H01L 23/528 |
| 2017/0200733 A1 * | 7/2017 | Lee | ............... H01L 21/76816 |

FOREIGN PATENT DOCUMENTS

| | | |
|---|---|---|
| KR | 1020160021376 A | 2/2016 |
| KR | 1020160106972 A | 9/2016 |

* cited by examiner

*Primary Examiner* — Hsien Ming Lee
(74) *Attorney, Agent, or Firm* — William Park & Associates Ltd.

(57) ABSTRACT

Provided herein may be a semiconductor device and a method of manufacturing the same. The method may include forming a second preliminary stack on a first preliminary stack; forming a first hard mask layer on the second preliminary stack; etching the first hard mask layer and forming holes through which the second preliminary stack is exposed; forming a second hard mask layer on the first hard mask layer to fill the holes; forming a linear trench by etching the second hard mask layer; forming a waved select line separation mask pattern by etching the exposed first hard mask layer; forming a select line separation trench by etching the exposed second preliminary stack using the select line separation mask pattern as an etching mask; and forming a select line separation layer by filling the select line separation trench with a non-conductor.

8 Claims, 37 Drawing Sheets

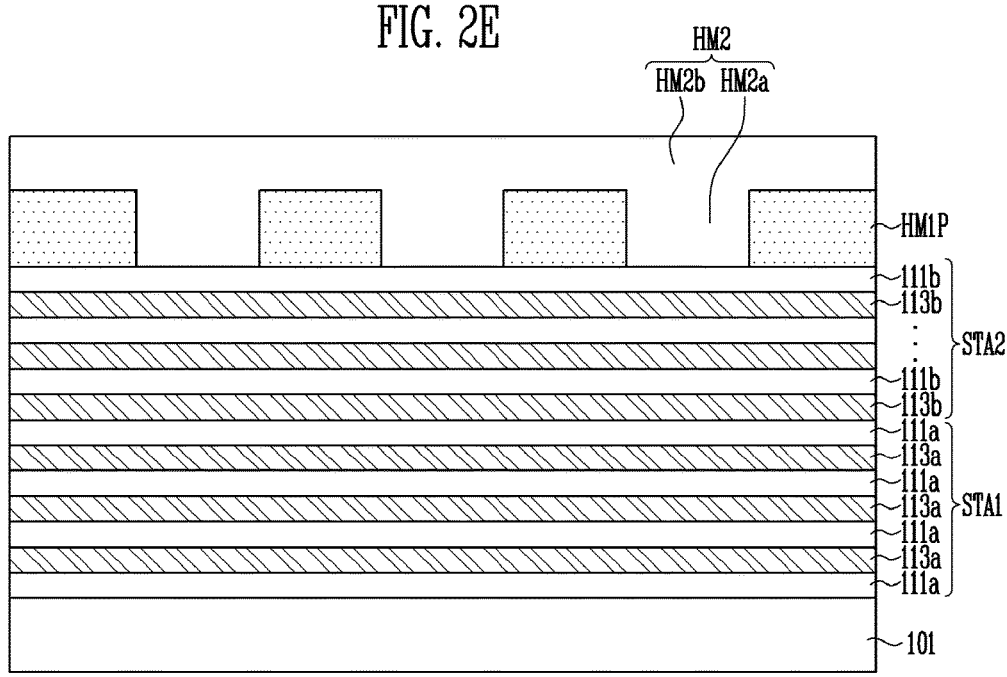
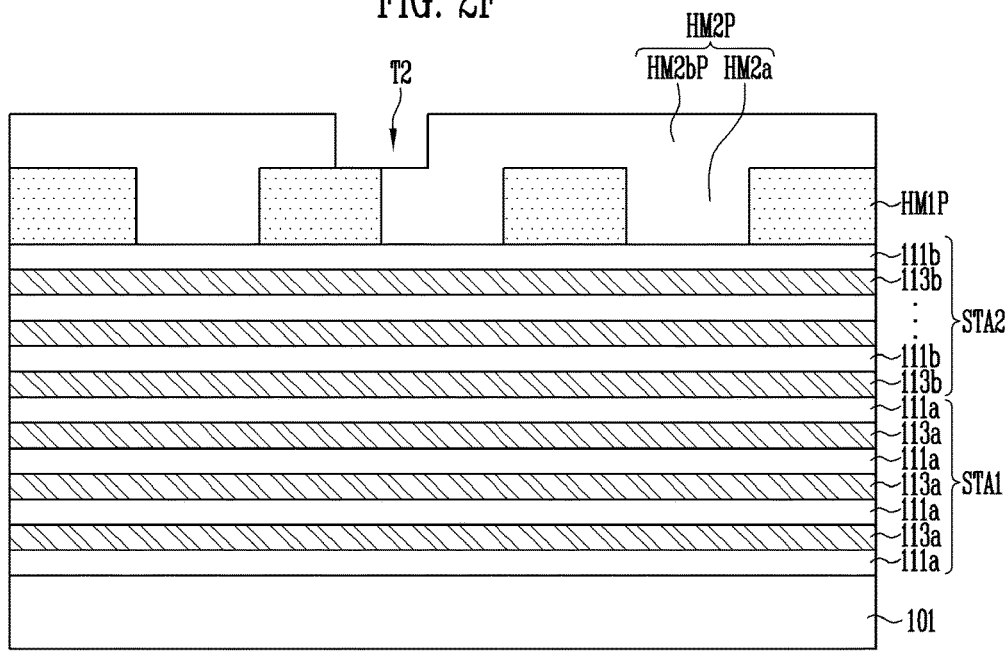

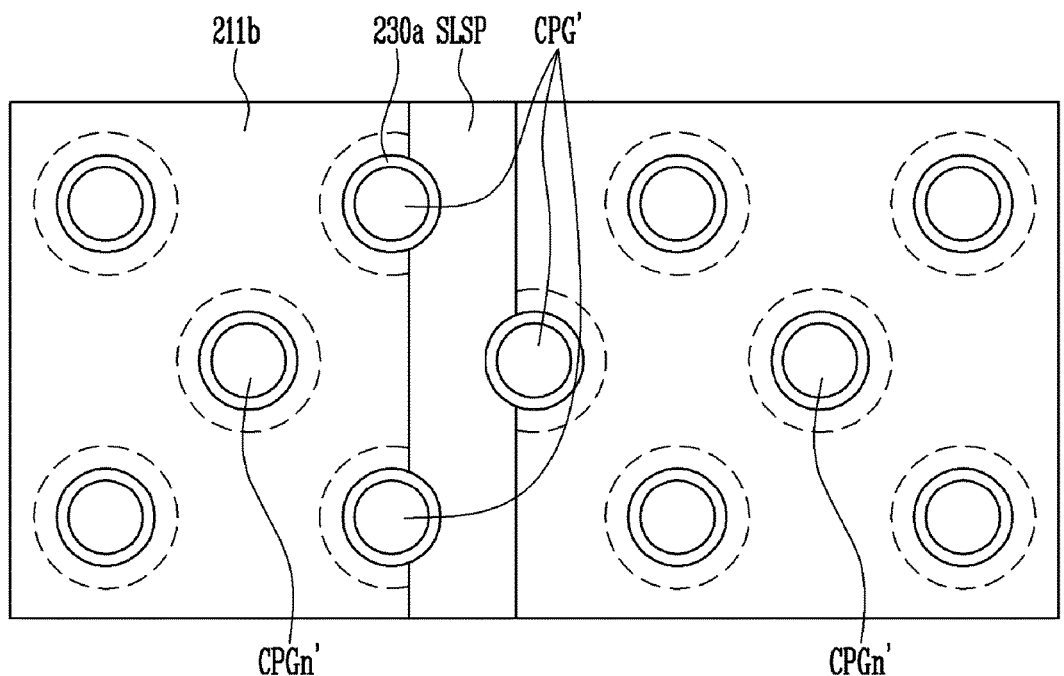

SEMICONDUCTOR DEVICE AND METHOD OF MANUFACTURING THE SAME

CROSS-REFERENCE TO RELATED APPLICATION

The present application claims priority under 35 U.S.C. § 119(a) to Korean patent application number 10-2017-0087866 filed on Jul. 11, 2017 in the Korean Intellectual Property Office, the entire disclosure of which is incorporated herein by reference.

BACKGROUND

1. Technical Field

Various embodiments of the present disclosure relate to a semiconductor device and a method of manufacturing the same, and more particularly, to a three-dimensional semiconductor memory device and a method of manufacturing the same.

2. Related Art

A semiconductor memory device may include a cell array region and a peripheral region. A string which includes memory cells arranged along a channel layer is formed in the cell array region. Operation circuit groups configured to perform a program operation, a read operation or an erase operation are formed in the peripheral region.

Word lines, select lines and bit lines are disposed in the cell array region. The word lines and bit lines are electrically coupled to the memory cells.

There is the need to electrically separate adjacent drain select lines coupled to the same bit line. For this, in the conventional technique, a separate dummy cell plug for forming a drain select line separation layer has been disposed between cell plugs, so that the space efficiency in the semiconductor memory device is reduced. In another conventional technique, a thin select line separation layer has been directly inserted between adjacent select lines. However, the operational reliability of the semiconductor memory device cannot be secured because it is very difficult to pattern a select line separation layer having a desired critical dimension following the recent trend towards the reduction in size of semiconductor devices.

SUMMARY

An embodiment of the present disclosure may provide for a method of manufacturing a semiconductor device. The method may include forming a second preliminary stack on a first preliminary stack. The method may include forming a first hard mask layer on the second preliminary stack. The method may include etching the first hard mask layer and forming holes through which the second preliminary stack is exposed. The method may include forming a second hard mask layer on the first hard mask layer to fill the holes; etching the second hard mask layer and forming a linear trench through which a portion of the first hard mask layer is exposed. The method may include etching the exposed portion of the first hard mask layer and forming a waved select line separation mask pattern such that a portion of the second preliminary stack is exposed. The method may include forming a select line separation trench by etching the exposed portion of the second preliminary stack using the select line separation mask pattern as an etching mask. The method may include forming a select line separation layer by filling the select line separation trench with a non-conductor.

An embodiment of the present disclosure may provide for a semiconductor device. The semiconductor device may include a lower stack. The semiconductor device may include a first upper stack disposed on the lower stack. The semiconductor device may include a second upper stack disposed on the lower stack, and spaced apart from the first upper stack by a select line separation trench. The semiconductor device may include first plugs configured to pass through the first upper stack and the lower stack, each of the first plugs including a sidewall protruding further than a sidewall of the first upper stack. The semiconductor device may include second plugs configured to pass through the second upper stack and the lower stack, each of the second plugs including a sidewall protruding further than a sidewall of the second upper stack. The semiconductor device may include a select line separation layer formed along a contour of the protruded sidewalls of the first and second plugs in the select line separation trench.

An embodiment of the present disclosure may provide for a semiconductor device. The semiconductor device may include a lower stack. The semiconductor device may include a first upper stack disposed on the lower stack. The semiconductor device may include a second upper stack disposed on the lower stack. The semiconductor device may include first plugs configured to pass through the first upper stack and the lower stack, each of the first plugs including a sidewall protruding further than a sidewall of the first upper stack. The semiconductor device may include second plugs configured to pass through the second upper stack and the lower stack, each of the second plugs including a sidewall protruding further than a sidewall of the second upper stack. The semiconductor device may include a select line separation layer disposed between the first upper stack and the second upper stack and formed to have a wave structure corresponding to a contour of the protruded sidewalls of the first and second plugs.

BRIEF DESCRIPTION OF THE DRAWINGS

FIGS. 2A to 2L are sectional views taken along line A-A' illustrated in FIG. 1, to illustrate a method of manufacturing the semiconductor device illustrated in FIG. 1.

FIGS. 9A to 9C are top plan views of the drawings illustrated in FIGS. 8A to 8C.

DETAILED DESCRIPTION

Figure 1:
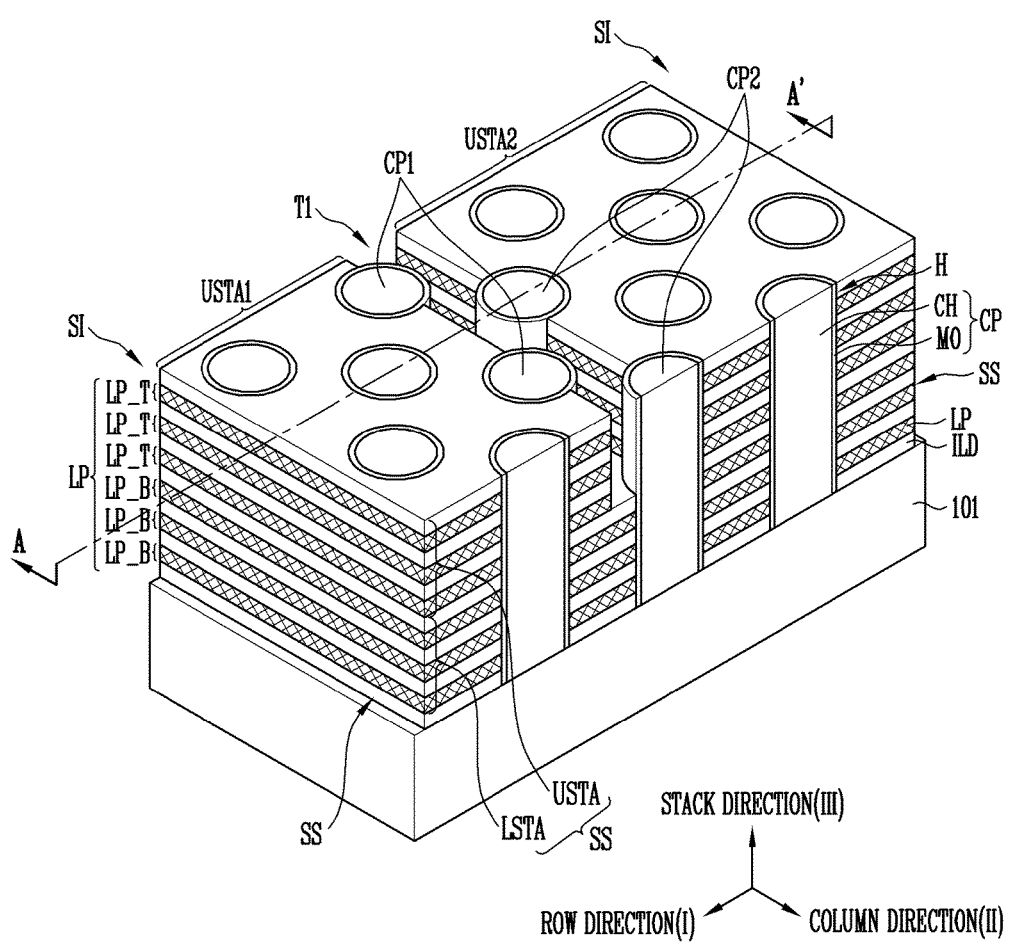
FIG. 1 is a perspective view illustrating a semiconductor device according to an embodiment of the present disclosure.

Examples of embodiments will now be described hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the examples of embodiments to those skilled in the art.

In the drawing figures, dimensions may be exaggerated for clarity of illustration. It will be understood that when an element is referred to as being "between" two elements, it can be the only element between the two elements, or one or more intervening elements may also be present.

Hereinafter, embodiments will be described with reference to the accompanying drawings. Embodiments are described herein with reference to cross-sectional illustrations that are schematic illustrations of embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but may include deviations in shapes that result, for example, from manufacturing. In the drawings, lengths and sizes of layers and regions may be exaggerated for clarity. Like reference numerals in the drawings denote like elements.

Terms such as 'first' and 'second' may be used to describe various components, but they should not limit the various components. Those terms are only used for the purpose of differentiating a component from other components. For example, a first component may be referred to as a second component, and a second component may be referred to as a first component and so forth without departing from the spirit and scope of the present disclosure. Furthermore, 'and/or' may include any one of or a combination of the components mentioned.

Furthermore, a singular form may include a plural from as long as it is not specifically mentioned in a sentence. Furthermore, "include/comprise" or "including/comprising" used in the specification represents that one or more components, steps, operations, and elements exist or are added.

Furthermore, unless defined otherwise, all the terms used in this specification including technical and scientific terms have the same meanings as would be generally understood by those skilled in the related art. The terms defined in generally used dictionaries should be construed as having the same meanings as would be construed in the context of the related art, and unless clearly defined otherwise in this specification, should not be construed as having idealistic or overly formal meanings.

It is also noted that in this specification, "connected/coupled" refers to one component not only directly coupling another component but also indirectly coupling another component through an intermediate component. On the other hand, "directly connected/directly coupled" refers to one component directly coupling another component without an intermediate component.

Various embodiment of the present disclosure may be directed to a semiconductor device in which a select line separation layer may be efficiently formed without using a dummy cell plug, and a method of manufacturing the same.

FIG. 1 is a perspective view illustrating a semiconductor device according to an embodiment of the present disclosure.

Figure 2A:
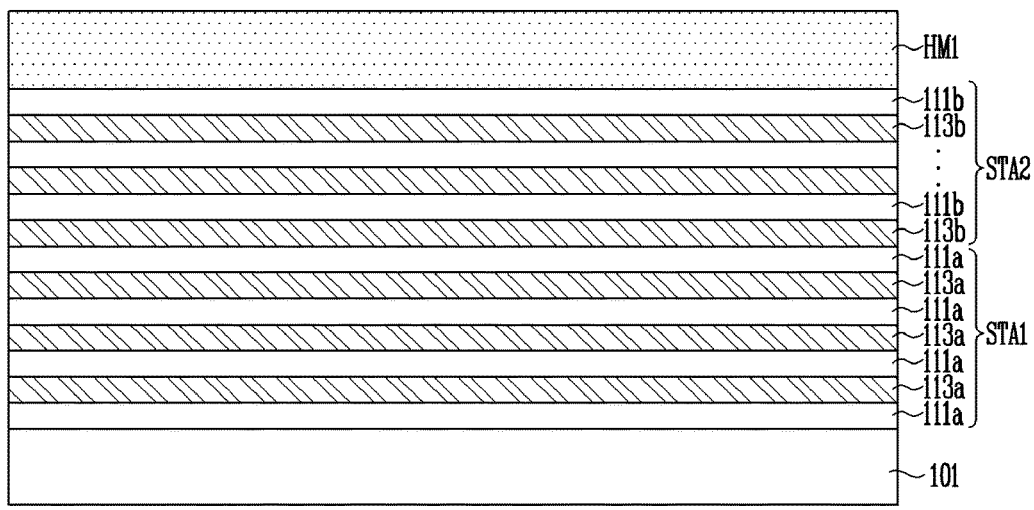
Figure 2B:
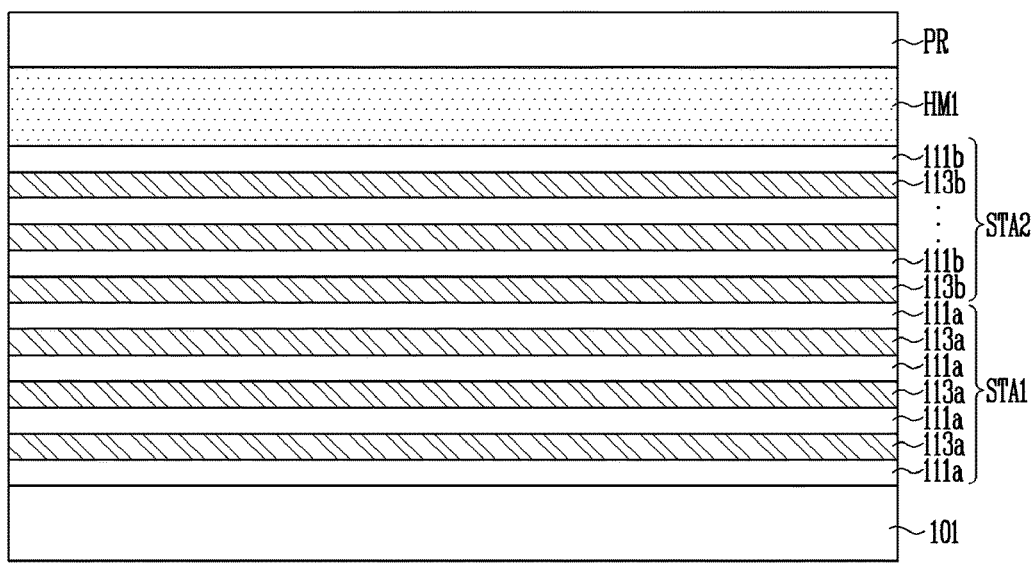
Figure 2C:
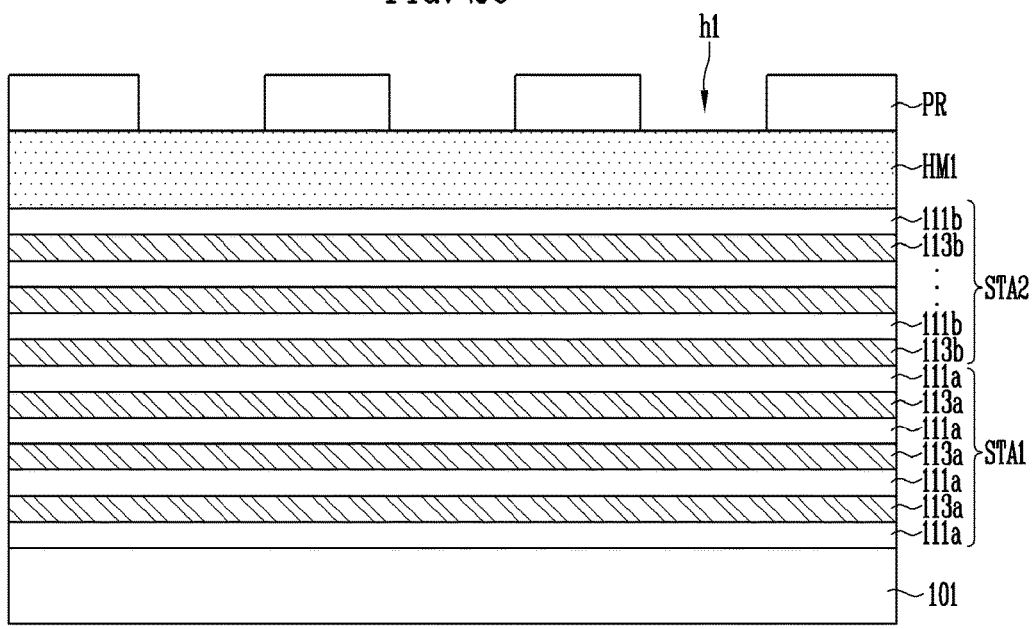
Figure 2D:
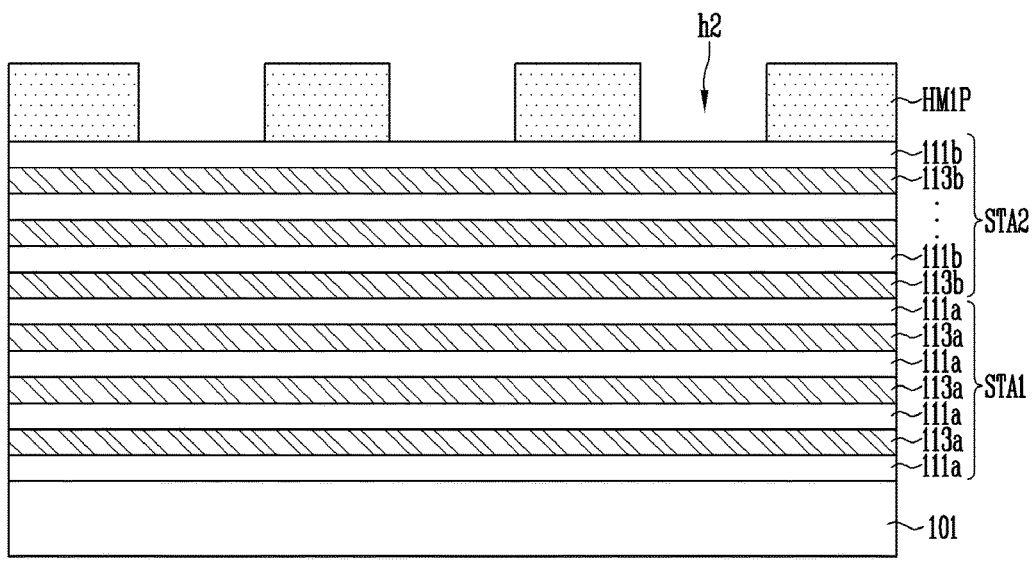
Figure 2G:
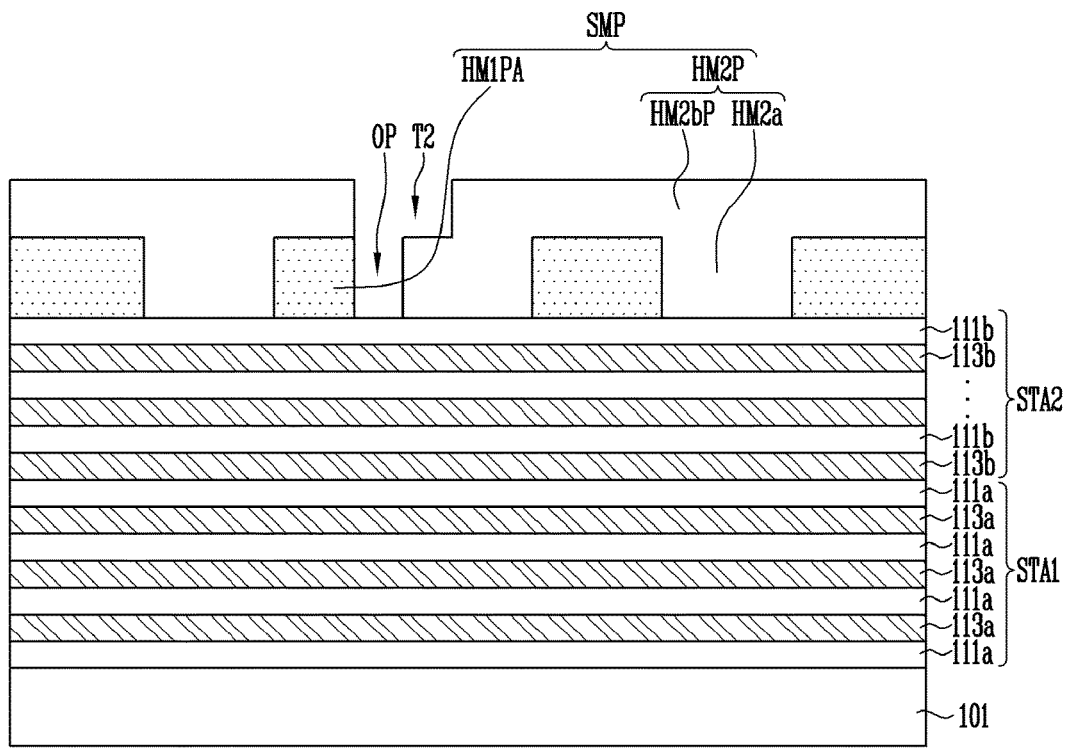
Figure 2H:
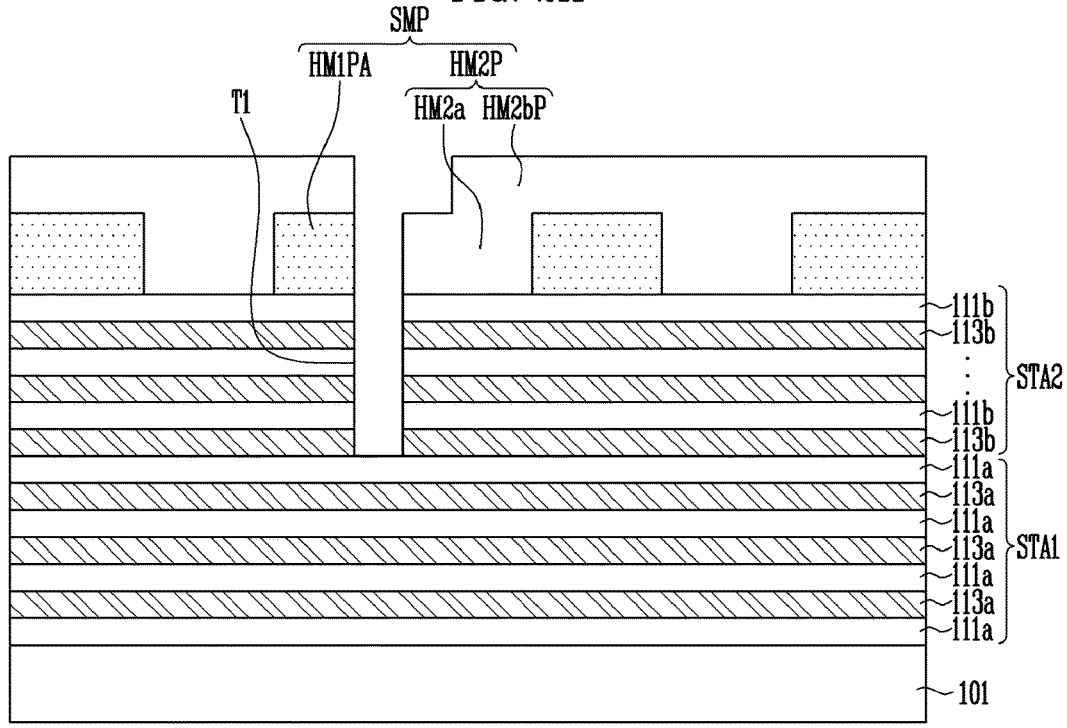
Figure 2I:
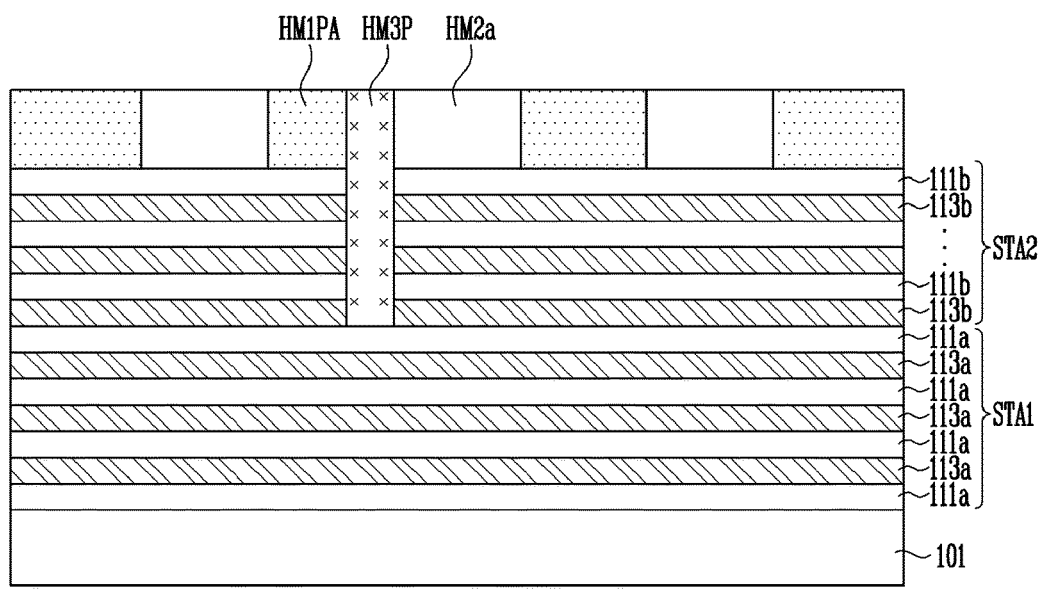
Figure 2J:
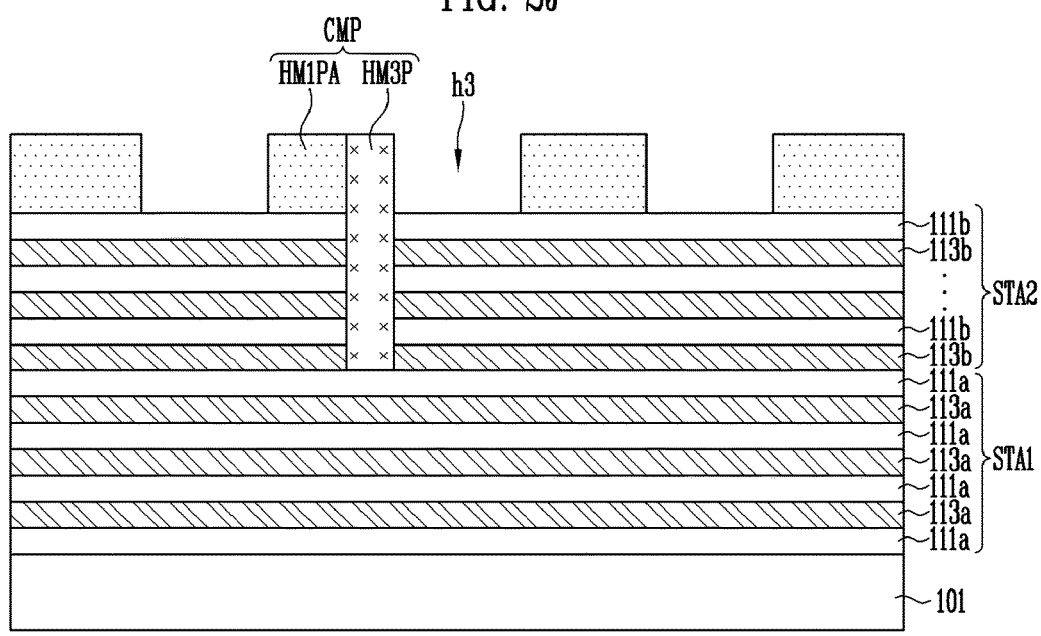
Figure 2K:
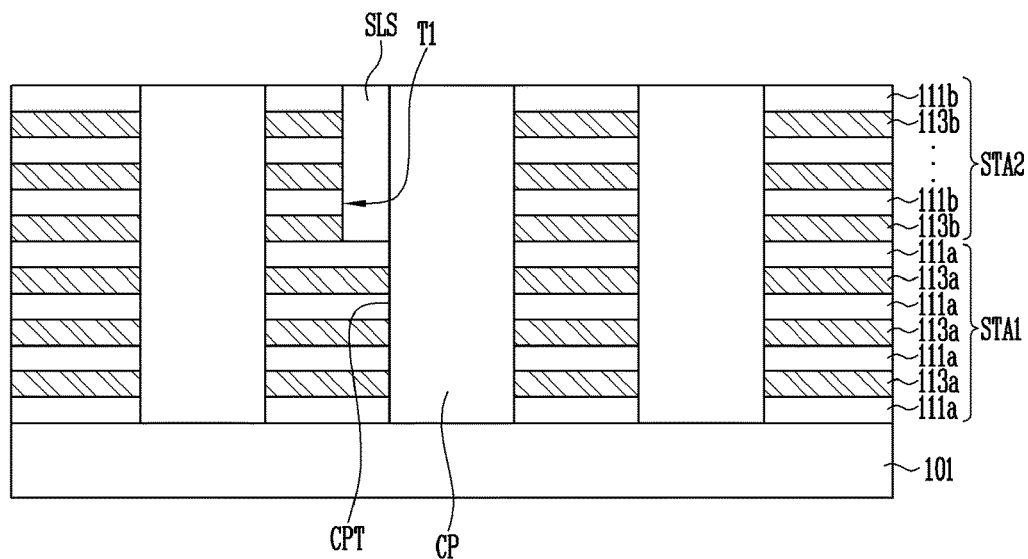

Referring to FIG. 1, a semiconductor device according to an embodiment of the present disclosure may include plugs CP extending parallel with each other, a stack SS enclosing the plugs CP, and a select line separation trench T1 passing through the stack SS by a predetermined depth. Although not illustrated for the sake of explanation, the semiconductor device may further include a select line separation layer (see reference character SLS of FIGS. 2K and 3K), with which the select line separation trench T1 is filled, and which will be explained later.

The plugs CP may be arranged in various forms in a row direction I and a column direction II.

The plugs CP are disposed in respective channel holes H passing through the stack SS.

The plugs CP pass through the stack SS in groups. In FIG. 1, there is illustrated the case where all plugs CP form one group and pass though one corresponding stack SS, but the present disclosure is not limited to this. For instance, another stack (not illustrated) penetrated by another group of plugs may be disposed on the left side of the stack SS, and another stack (not illustrated) penetrated by another group of plugs may be disposed on the right side of the stack SS. The stacks may be spaced apart from each other by slits SI.

To increase the number of plugs CP disposed in a unit area, the plugs CP may be arranged in a zigzag manner in the row direction I and the column direction II.

Each of the plugs CP may include a channel column CH and a memory layer MO enclosing an outer surface of the channel column CH.

The channel column CH may include a tubular semiconductor layer which is formed along an inner surface of the memory layer MO, and an insulating layer with which a central region of the tubular semiconductor layer is filled. Alternatively, the channel column CH may include an embedded semiconductor layer which is formed to fill space from the inner surface of the memory layer MO to a central axis of a corresponding channel hole H. As a further alternative, the channel column CH may be formed by a combination of the embedded semiconductor layer and the tubular semiconductor layer.

The memory layer MO may include a tunnel insulating layer, a data storage layer and a blocking insulating layer that enclose the channel column CH. The tunnel insulating layer may be formed to come into contact with the outer surface of the channel column CH and enclose the channel column CH. The data storage layer may be formed to enclose the channel column CH with the tunnel insulating layer provided therebetween. The blocking insulating layer may be formed to enclose the channel column CH with the data storage layer and the tunnel insulating layer provided therebetween. The tunnel insulating layer may be formed of a silicon oxide layer. The data storage layer may be formed of a material layer capable of trapping charges. For example, the data storage layer may be formed of a silicon nitride layer. The blocking insulating layer may be formed of a silicon oxide layer. The blocking insulating layer may be formed of a high dielectric layer which has a dielectric permittivity higher than that of the silicon oxide layer.

The stack SS may be separated from other adjacent stacks (not illustrated) by the slits SI.

The stack SS may include a plurality of interlayer insulating patterns ILD and a plurality of conductive line patterns LP which are alternately stacked on a lower structure 101.

A stack direction III of the interlayer insulating patterns ILD and the conductive line patterns LP is the same as a direction in which the plugs CP extend.

The lower structure 101 may include a pipe gate in which a pipe channel is embedded. The lower structure 101 may be a substrate including a source region or a source line. An example of the lower structure 101 will be described later with reference to FIGS. 12 and 13.

Among the conductive line patterns LP of the stack SS, at least one or more upper conductive line patterns disposed adjacent to an upper surface of the stack SS may be used as a drain select line or a source select line, and the other conductive line patterns other than the upper conductive line patterns, that is, lower conductive line patterns may be used as word lines. Alternatively, among the conductive line patterns LP of the stack SS, at least one or more upper conductive line patterns disposed adjacent to the upper surface of the stack SS may be used as the drain select line, at least one or more lower conductive line patterns disposed adjacent to the lower structure 101 may be used as the source select line, and the other conductive line patterns other than the upper conductive line patterns and the lower conductive line patterns may be used as the word lines.

In the present disclosure, for the sake of explanation, there is illustrated the case where the conductive line patterns LP are divided into three upper conductive line patterns LP_T and three lower conductive line patterns LP_B disposed below the upper conductive line patterns LP_T. However, the present disclosure is not limited to this. The three upper conductive line patterns LP_T may be used as drain select lines or source select lines. The three lower conductive line patterns LP_B may be used as word lines. Alternatively, the three lower conductive line patterns LP_B may be used as the word lines and the source select lines disposed below the word lines.

The conductive line patterns LP disposed on the same plane may be separated from each other by the slits SI. The plugs CP may be arranged in a zigzag manner in the row direction I and the column direction II, and be coupled to bit lines (not illustrated) disposed on the stack SS. The bit lines (not illustrated) may extend in the row direction I. The plugs CP arranged in a line along the direction in which the bit lines (not illustrated) extend may be coupled to the same bit line.

The slits SI may separate the lower conductive line patterns LP_B disposed on the same plane from each other. The upper conductive line patterns LP_T disposed on the same plane may be separated from each other by the slit SI and the select line separation trench T1. The select line separation trench T1 may overlap the lower conductive line patterns LP_B. The select line separation trench T1 may have a wave shape.

Therefore, the stack SS may be divided into a lower stack LSTA which includes the lower conductive line patterns LP_B and the interlayer insulating patterns ILD that are alternately stacked, and an upper stack USTA which includes the upper conductive line patterns LP_T and the interlayer insulating patterns ILD that are alternately stacked. The upper stack USTA may also be divided into a first upper stack USTA1 and a second upper stack USTA2 by the select line separation trench T1.

The plugs CP may include first plugs CP1 passing through the first upper stack USTA1 and the lower stack LSTA, and second plugs CP2 passing through the second upper stack USTA2 and the lower stack LSTA.

Referring to FIG. 1, some of the first plugs CP1 may include a sidewall protruding further than a sidewall of the first upper stack USTA1. In other words, the sidewall of each corresponding first plug CP1 may protrude further than the sidewall of the first upper stack USTA1 that is exposed through the select line separation trench T1. Some of the second plugs CP2 may include a sidewall protruding further than a sidewall of the second upper stack USTA2. In other words, the sidewall of each corresponding second plug CP1 may protrude further than the sidewall of the second upper stack USTA2 that is exposed through the select line separation trench T1. The select line separation trench T1 is formed in the column direction II to traverse the space between the plugs CP1 and CP2 arranged in a zigzag manner. As will be described later, the select line separation trench T1 is filled with the select line separation layer (see reference character SLS of FIGS. 2K and 3K). Consequently, the select line separation layer disposed between the first upper stack USTA1 and the second upper stack USTA2 is formed along the contour of the protruded sidewalls of the first and second plugs CP1 and CP2.

According to an embodiment of the present disclosure, the select line separation trench T1 is formed in a wave shape along the contour of the protruded sidewalls of the first and second plugs CP1 and CP2 and the contour of the exposed sidewalls of the first upper stack USTA1 and the second upper stack USTA2. The select line separation layer with which the select line separation trench T1 is filled may also have a wave shape.

According to an embodiment of the present disclosure, the select line separation layer may be efficiently formed without using a dummy plug for forming select line separation layers which has been used in the conventional technique. Furthermore, since the select line separation layer may be patterned in a desired form even when the select line separation layer is designed to have a small critical dimension (CD), the operational reliability of the semiconductor memory device may be ensured. In other words, embodiments of the present disclosure propose an improved select line separating technique.

Hereinafter, a method of manufacturing the semiconductor memory device according to an embodiment of the present disclosure will be described, centered on a process of forming the select line separation trench T1 with reference to FIGS. 2A to 3L.

FIGS. 2A to 2L are sectional views taken along line A-A' illustrated in FIG. 1, to illustrate a method of manufacturing the semiconductor device illustrated in FIG. 1. FIGS. 3A to 3L are top plan views of the drawings illustrated in FIGS. 2A to 2L.

Referring to FIGS. 2A to 2D and 3A to 3D, a first preliminary stack STA1 is formed on the lower structure 101. The first preliminary stack STA1 includes interlayer insulating layers 111a and sacrificial layers 113a that are alternately stacked.

A second preliminary stack STA2 is formed on the first preliminary stack STA1. The second preliminary stack STA2 includes interlayer insulating layers 111*b* and sacrificial layers 113*b* that are alternately stacked.

As will be described later, in the first preliminary stack STA1, the sacrificial layers 113*a* are replaced with conductive line patterns to form the lower stack (LSTA of FIG. 1). In the second preliminary stack STA2, the sacrificial layers 113*b* are replaced with conductive line patterns to form the upper stack (USTA of FIG. 1). The lower stack (LSTA of FIG. 1) may be used as word lines, or word lines and select lines, e.g., source select lines disposed below the word lines. The upper stack (USTA of FIG. 1) may be used as select lines, e.g., drain select lines.

The sacrificial layers 113*a* and 113*b* may be made of material having an etch selectivity relative to the interlayer insulating layers 111*a* and 111*b*. For example, the interlayer insulating layers 111*a* and 111*b* may be formed of silicon oxide layers, and the sacrificial layers 113*a* and 113*b* may be formed of silicon nitride layers.

Thereafter, a first hard mask layer HM1 is formed on the second preliminary stack STA2. For example, the first hard mask layer HM1 may include at least one of amorphous carbon, poly silicon, titanium nitride (TiN), tantalum (Ta), titanium (Ti), tungsten (W), an amorphous carbon layer (ACL), silicon oxynitride (SiON), and tetraethyle orthosilicate (TEOS). In the present disclosure, for the sake of explanation, the first hard mask layer HM1 is illustrated as being made of amorphous carbon. However, the present disclosure is not limited to this.

Thereafter, a photoresist layer PR is formed on the entire structure provided with the first hard mask layer HM1.

Subsequently, holes h1 through which portions of an upper surface of the first hard mask layer HM1 are exposed are formed by performing an exposure and development process on the photoresist layer PR. The holes h1 may be disposed in a zigzag manner.

Thereafter, a first hard mask pattern HM1P is formed by etching the exposed portions of the first hard mask layer HM1. The first hard mask pattern HM1P is formed to have holes h2 through which portions of an upper surface of the second preliminary stack STA2 are exposed. The holes h2 may be arranged in a zigzag manner, and formed to expose the upper surface of the second preliminary stack STA2. Thereafter, the photoresist layer PR is removed.

Referring to FIGS. 2E to 2F and 3E to 3F, a second hard mask layer HM2 is formed on the first hard mask pattern HM1P such that the holes h2 are filled with the second hard mask layer HM2.

The second hard mask layer HM2 may include at least one of amorphous carbon, poly silicon, titanium nitride (TiN), tantalum (Ta), titanium (Ti), tungsten (W), an amorphous carbon layer (ACL), silicon oxynitride (SiON), and tetraethyle orthosilicate (TEOS), and be formed of material having an etch selectivity relative to the material constituting the above-described first hard mask layer HM1. For example, in the case where the first hard mask layer HM1 is made of amorphous carbon, the second hard mask layer HM2 may be made of poly silicon. However, the present disclosure is not limited to this. The reason why the second hard mask layer HM2 is formed of material having an etch selectivity relative to that of the first hard mask layer HM1 may be, for example, to make it possible to perform a self-aligned mask patterning process for forming a select line separation trench.

The second hard mask layer HM2 may be divided into a second lower mask layer HM2*a* disposed on the same layer as that of the first hard mask pattern HM1P to fill the holes h2, and a second upper mask layer HM2*b* formed on the first hard mask pattern HM1P and the second lower mask layer HM2*a*.

Thereafter, a linear trench T2 is formed by etching portion of the second hard mask layer HM2. Here, the other portion of the second hard mask layer HM2 that remains after the etching has been performed refers to a second hard mask pattern HM2P in the drawings.

When it is assumed that the second hard mask layer HM2 is divided into the second lower mask layer HM2*a* disposed on the same layer as that of the first hard mask pattern HM1P to fill the holes h2, and the second upper mask layer HM2*b* formed on the first hard mask pattern HM1P and the second lower mask layer HM2*a*, the linear trench T2 is formed by etching portion of the second upper mask layer HM2*b*. The second upper mask layer HM2*b* having the trench T2 therein refers to a second upper mask layer pattern HM2*b*P in the drawings. Such division is only for illustrating embodiments of the present disclosure, and a layer disposed on the same layer as that of the first hard mask pattern HM1P may not be the second lower mask layer HM2*a*, and a layer disposed on the second lower mask layer HM2*a* may not be the second upper mask layer HM2*b*. For instance, the second lower mask layer HM2*a* may include a portion of the second upper mask layer HM2*b* including a boundary with the second upper mask layer HM2*b*, and the second upper mask layer HM2*b* may include a portion of the second lower mask layer HM2*a* including a boundary with the second lower mask layer HM2*a*.

Figure 3A:
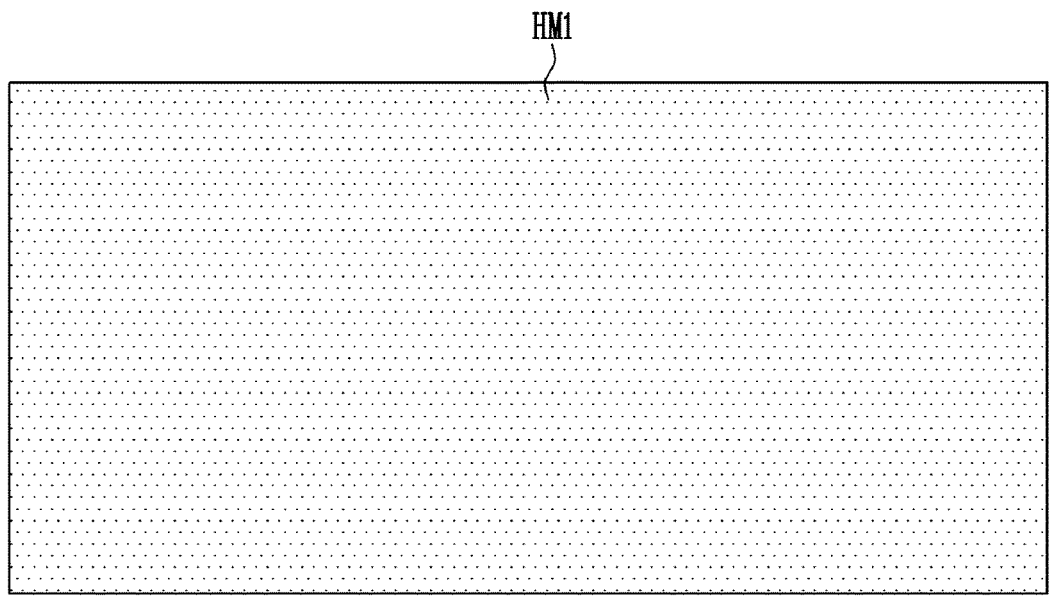
FIGS. 3A to 3L are top plan views of the drawings illustrated in FIGS. 2A to 2L.
Figure 3B:
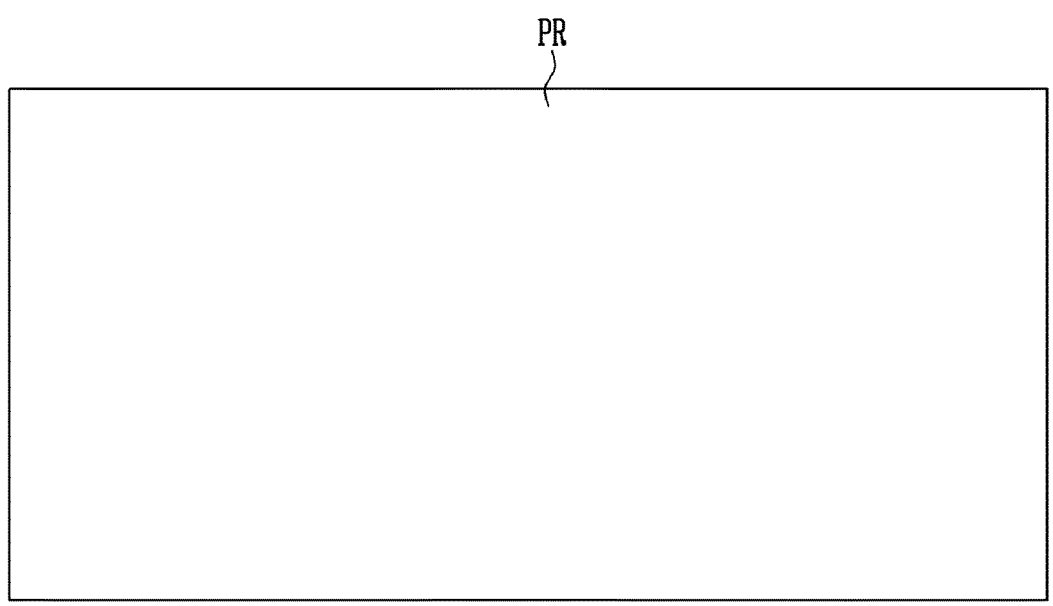
Figure 3C:
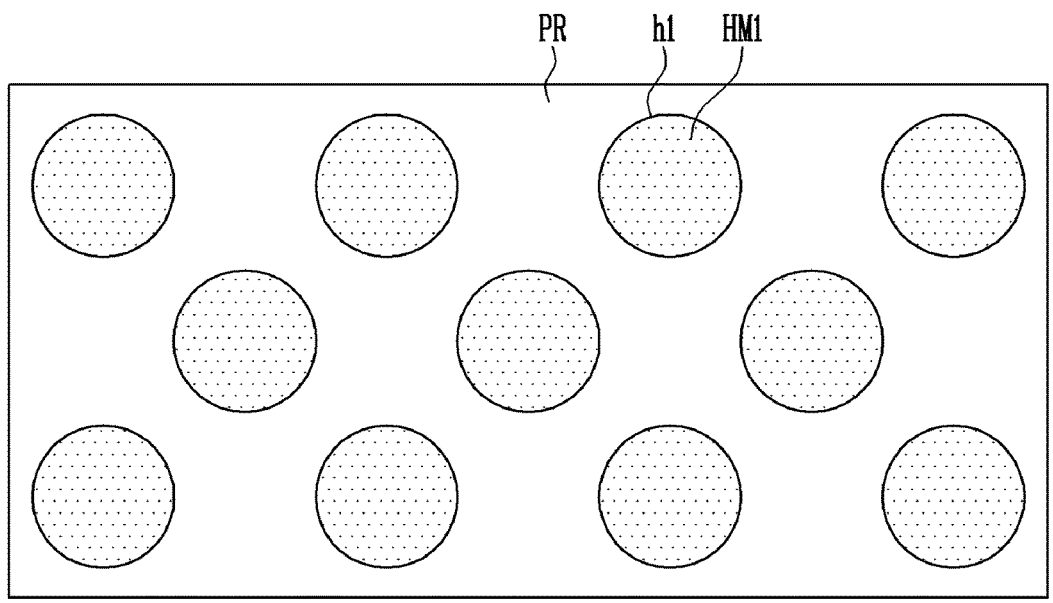
Figure 3D:
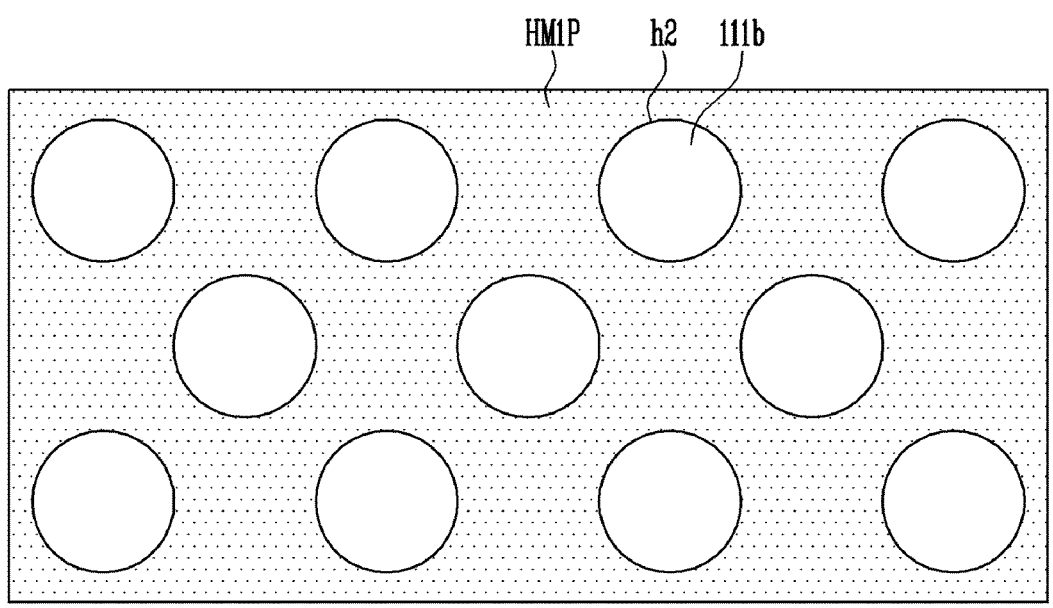
Figure 3E:
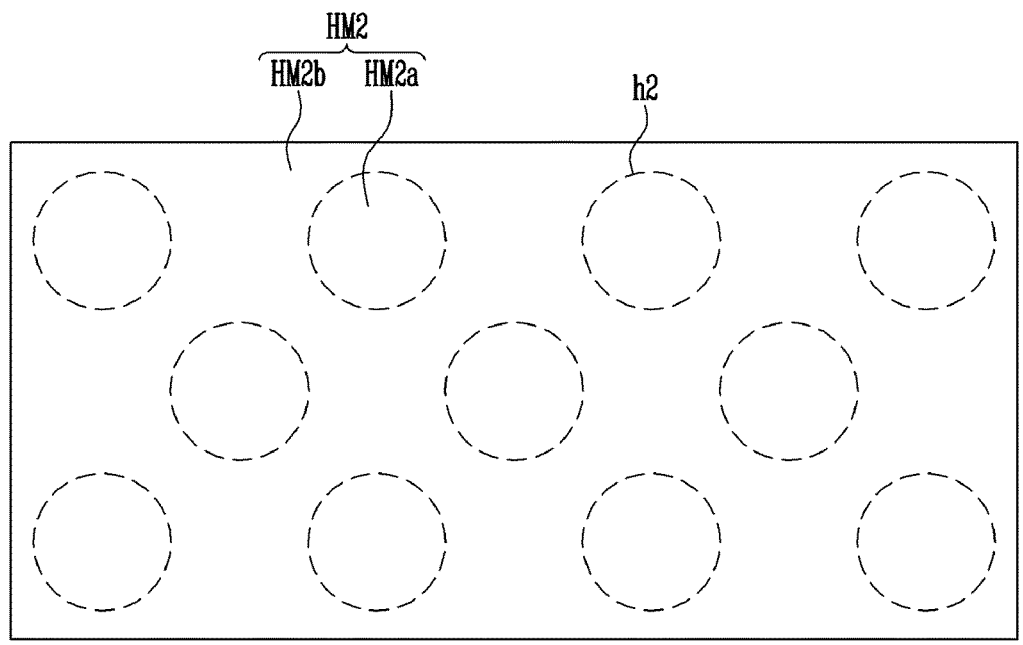
Figure 3F:
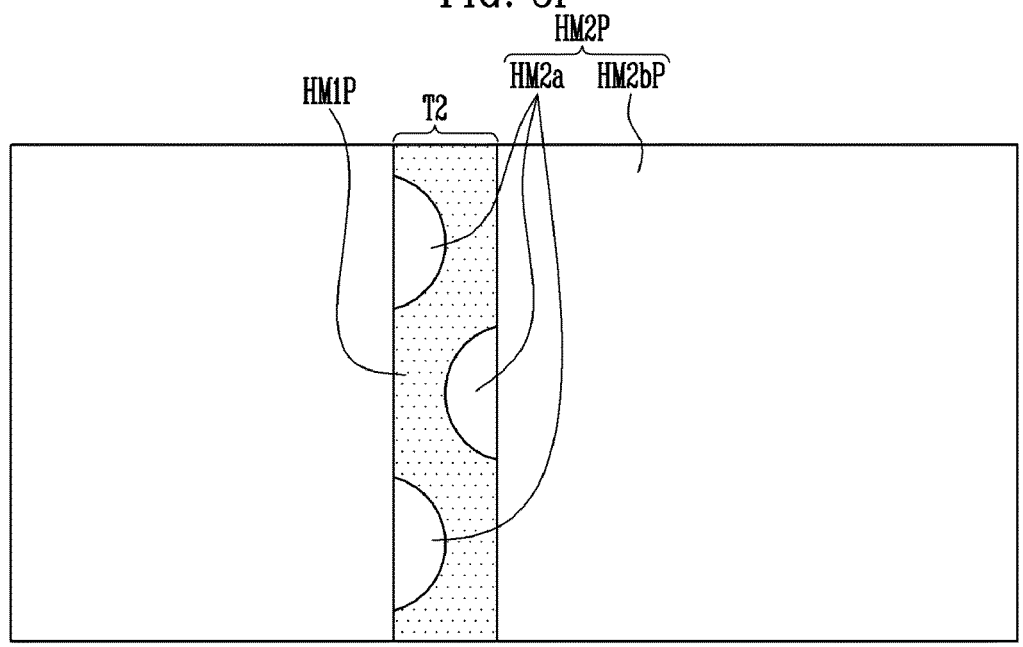
Figure 3G:
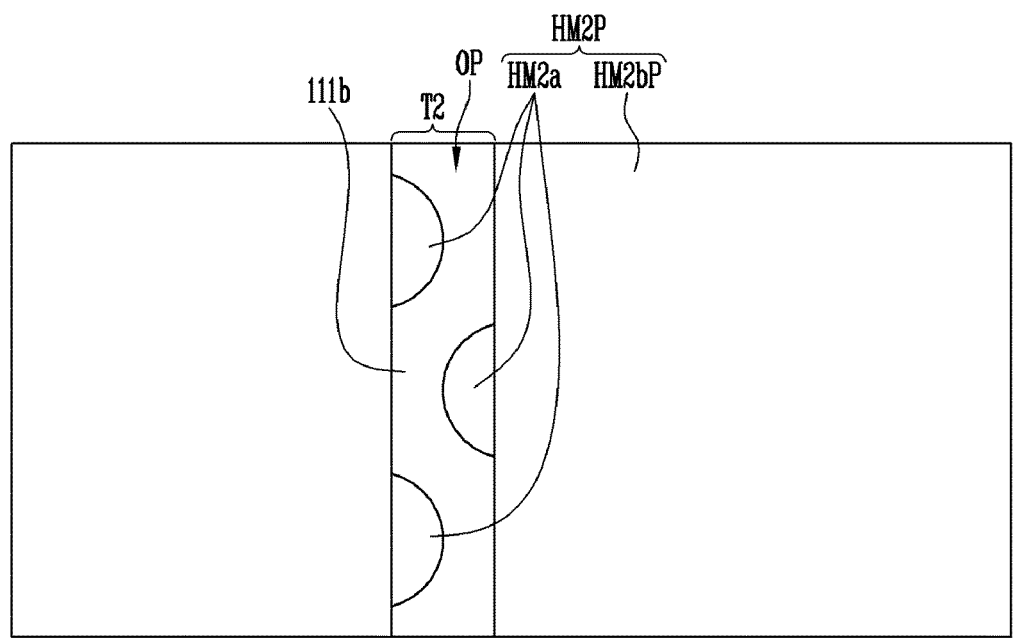
Figure 3H:
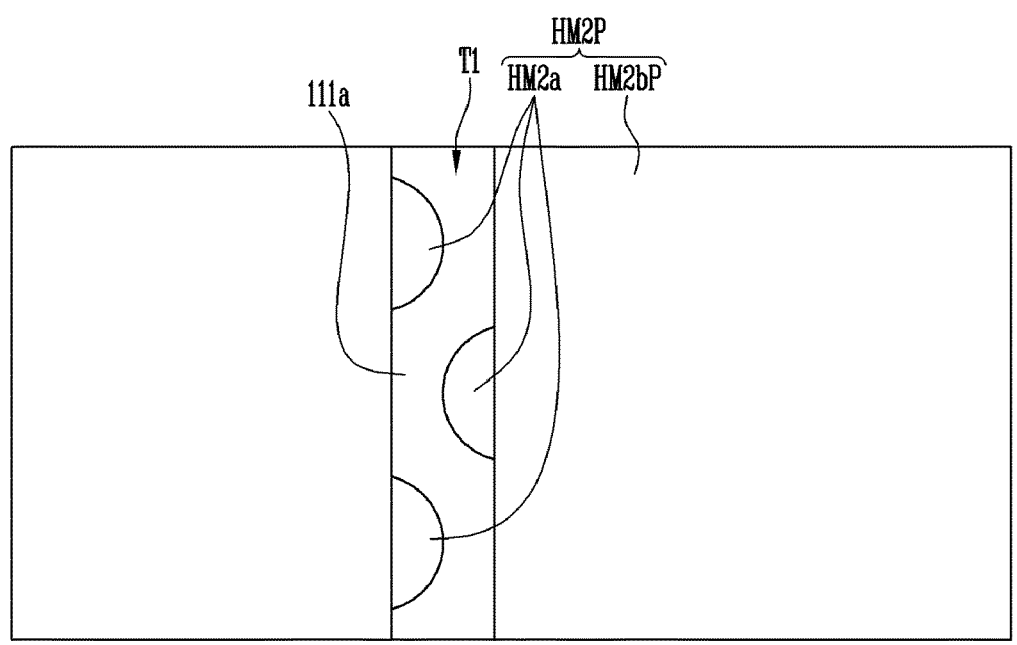
Figure 3I:
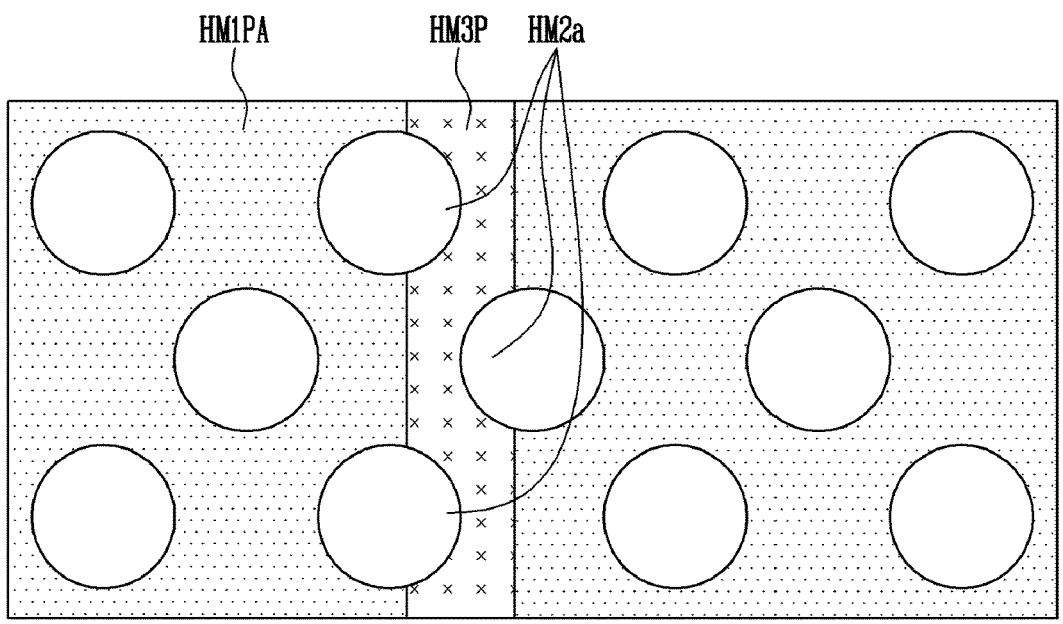
Figure 3J:
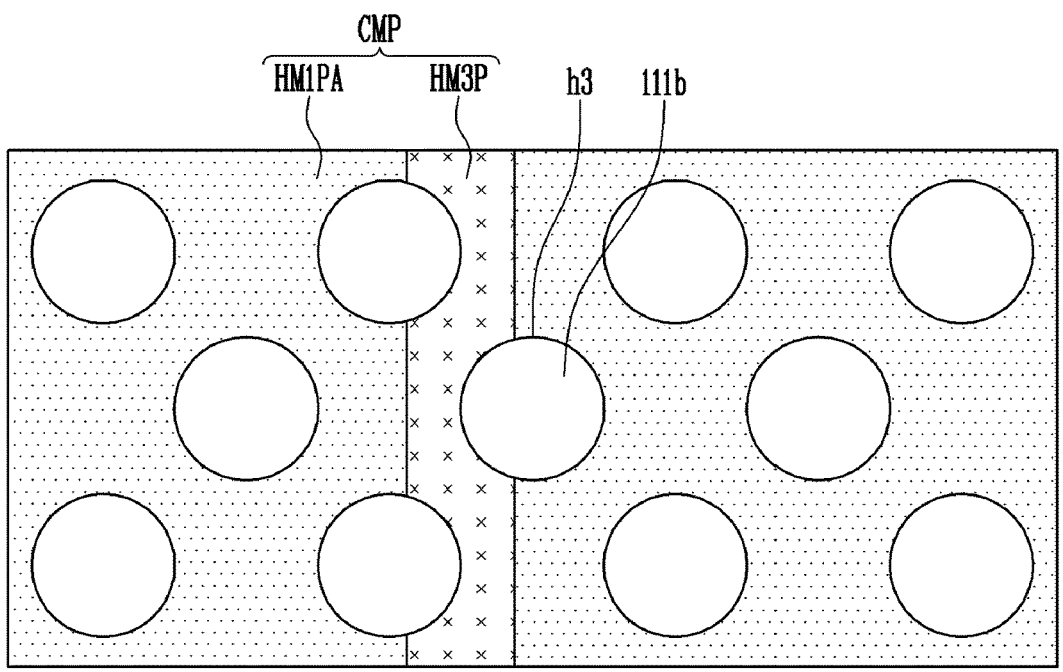
Figure 3K:
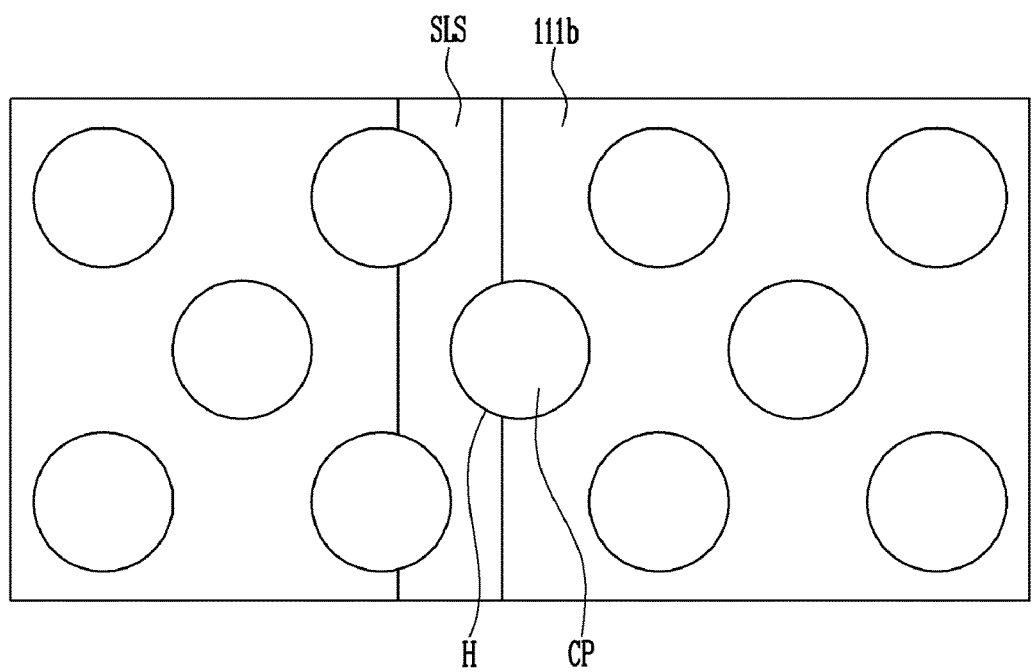

The trench T2 may be disposed in an upper region of the second hard mask pattern HM2P between the holes h2 arranged in a zigzag manner, and be formed such that a portion of an upper surface of the first hard mask pattern HM1P and a portion of an upper surface of the second lower mask layer HM2*a* are exposed. In other words, the trench T2 is formed to overlap the first hard mask pattern HM1P and the second lower mask layer HM2*a*. It is preferable that the portion of the upper surface of the first hard mask pattern HM1P that is exposed through the trench T2 have a wave shape, as illustrated in FIG. 3F.

During the etching process for forming the trench T2, the first hard mask pattern HM1P having an etch selectivity relative to the second hard mask layer HM2 may be used as an etch stop layer.

Subsequently, referring to FIGS. 2G to 2H and 3G to 3H, a select line separation mask pattern SMP is formed by etching the waved first hard mask pattern HM1P exposed through the trench T2. An opening OP through which a portion of an upper surface of the interlayer insulating layer 111*b* disposed at an uppermost layer of the second preliminary stack STA2 is exposed is formed by etching a portion of the first hard mask pattern HM1P. The opening OP also has a wave shape due to the etched first hard mask pattern HM1P.

Since the first hard mask layer HM1 and the second hard mask layer HM2 are made of different materials having an etch selectivity with respect to each other, selective etching using a difference in material between the first hard mask pattern HM1P and the second hard mask pattern HM2P is possible.

In addition, the trench T2 is disposed to pass through the upper region of the second hard mask pattern HM2P between the holes h2 arranged in a zigzag manner. Thus, when the first hard mask pattern HM1P exposed through the trench T2 is selectively etched and removed, the waved opening OP is automatically formed under the trench T2. The first hard mask pattern HM1P of which a portion exposed through the trench T2 has been removed refers to a first sub-mask pattern HM1PA in the drawings. As illustrated in the drawings, because the portion of the first hard mask pattern HM1P that is exposed through the trench T2 is removed, the trench T2 does not overlap the first sub-mask pattern HM1PA.

The select line separation mask pattern SMP includes the first sub-mask pattern HM1PA and the second hard mask pattern HM2P. For example, the select line separation mask pattern SMP is formed of the second lower mask layer HM2a which fills the holes h2 and remains therein, and the first sub-mask pattern HM1PA which does not overlap the trench T2.

The opening OP is defined in a lower region of the trench T2. As described above, a sidewall of the first hard mask pattern HM1P and a sidewall and an upper portion of the second lower mask layer HM2a are exposed through the trench T2 and the opening OP. The opening OP is defined in a region in which the trench T2 overlaps the removed portion of the first hard mask pattern HM1P that was exposed through the trench T2.

The select line separation mask pattern SMP including the waved opening OP is formed by the above-described steps.

Thereafter, the second preliminary stack STA2 is etched using the select line separation mask pattern SMP including the waved opening OP as an etching mask, whereby the select line separation trench T1 is formed.

Here, the select line separation trench T1 may have a wave shape.

Subsequently, as will be described later, a select line separation layer SLS may be formed by filling the select line separation trench T1 with a non-conductor. In an embodiment, for example, a non-conductor may include a non-conductive layer, filler, or material etc.

In this way, the first sub-mask pattern HM1PA and the second hard mask pattern HM2P may be formed through an etching process using an etch selectivity between the first hard mask layer HM1 and the second hard mask layer HM2, whereby the waved select line separation trench T1 may be self-aligned.

According to an embodiment of the present disclosure, if a select line (e.g., a drain select line) is separated into parts, the dummy plug or the like which has been used in the conventional technique may not be used. This structure makes arrangement of plugs more compact. Because unnecessary plugs may be removed, it is very advantageous in terms of bit growth and an increase in net die. Furthermore, an embodiment of the present disclosure using the self-align method may make it easy, for example, to control CD (Critical Dimensions) and the wave angle of the select line separation layer, compared to the conventional technique, in which a select line separation layer is formed in a wave shape, and a select line is separated into parts by directly passing the select line separation layer through space between plugs.

Hereinafter, a process of forming a plug mask pattern CMP using the above-described first sub-mask pattern HM1PA will be described below.

Referring to FIGS. 2I to 2J and 3I to 3J, before the select line separation layer SLS is formed, a third hard mask layer (not illustrated) with which the select line separation trench T1 and the opening OP are filled is formed, and the second hard mask pattern HM2P and the third hard mask layer (not illustrated) are etched back to a depth at which the first sub-mask pattern HM1PA is exposed. During the etch-back process, the second upper mask pattern HM2bP of the second hard mask pattern HM2P and the third hard mask layer (not illustrated) disposed on the same layer as that of the second upper mask pattern HM2bP are removed. The etched-back third hard mask layer refers to a third hard mask pattern HM3P in the drawings.

The third hard mask pattern HM3P may include at least one of amorphous carbon, poly silicon, titanium nitride (TiN), tantalum (Ta), titanium (Ti), tungsten (W), amorphous carbon layer (ACL), silicon oxynitride (SiON), and tetraethyle orthosilicate (TEOS), and be formed of material having an etch selectivity relative to the material constituting the above-described second hard mask layer HM2. Since the second hard mask pattern HM2P is completely removed during the process of forming the plug mask pattern CMP, it is advantageous in an etching process that the third hard mask pattern HM3P is formed of material having an etch selectivity relative to that of the second hard mask layer HM2. The third hard mask pattern HM3P may be made of the same material as that of the first hard mask layer HM1. As will be described later, since the third hard mask pattern HM3P along with the first sub-mask pattern HM1PA forms the plug mask pattern CMP, it is advantageous in the etching process that the third hard mask pattern HM3P and the first sub-mask pattern Hm1PA are made of the same material. For example, when the first hard mask layer HM1 is made of amorphous carbon, the third hard mask pattern HM3P may also be made of the amorphous carbon. While the first hard mask layer HM1 and the third hard mask pattern HM3P are formed of material different from that of the second hard mask layer HM2, the first hard mask layer HM1 and the third hard mask pattern HM3P may be formed of the same material.

Subsequently, the second hard mask pattern HM2P is completely removed. In other words, the second lower mask layer HM2a that fills the holes h2 and remains therein is removed. Consequently, the plug mask pattern CMP which includes holes h3 corresponding to the holes h2 is formed. The holes h3 are arranged in a zigzag manner corresponding to the holes h2.

It may be understood that the process of forming the plug mask pattern CMP is a process in which the portion of the first hard mask pattern HM1P that has been etched for forming the opening OP of the select line separation mask pattern SMP is filled with the third hard mask pattern HM3P. In other words, it may be understood that the opening OP is filled with the third hard mask pattern HM3P. In this way, the plug mask pattern CMP including the holes h3 identical with the holes h2 of the first hard mask pattern HM1P is formed.

Consequently, the plug mask pattern CMP is formed of the first sub-mask pattern HM1PA and the third mask pattern HM3P.

Subsequently, referring to FIGS. 2K to 2L and 3K to 3L, channel holes H are formed by etching the first preliminary stack STA1 and the second preliminary stack STA2 using the plug mask pattern CMP as an etching mask.

Plugs CP are formed in the respective channel holes H. The plug CP may include the memory layer (MO of FIG. 1). The plug CP may include the channel column (CH of FIG. 1) enclosed by the memory layer.

Thereafter, the third mask pattern HM3P is removed to expose the first preliminary stack STA1 through the select line separation trench T1. Consequently, the select line separation trench T1 is open again.

The select line separation layer SLS may be formed by filling the opened select line separation trench T1 with insulating material including oxide.

Subsequently, the slits (SI of FIG. 1) passing through the first and second preliminary stacks STA1 and STA2 are formed.

The sacrificial layers 113a and 113b of the first and second preliminary stacks STA1 and STA2 exposed through the slits are removed and respectively replaced with the conductive line patterns LP_B and LP_T. The lower stack LSTA is formed by replacing the sacrificial layers 113a of the first preliminary stack STA1 with the conductive line patterns LP_B. The upper stack USTA is formed by replacing the sacrificial layers 113b of the second preliminary stack STA2 with the conductive line patterns LP_T. The conductive line patterns LP_B and LP_T may include tungsten layers, metal layers and the like.

Although the foregoing description has been focused on the embodiments (for the sake of description, hereinafter, referred to as first embodiments) in which select lines and word lines are formed by a single plug, there will be described embodiments (for the sake of description, hereinafter, referred to as second embodiments) in which plugs are divided into a select plug for forming select lines and a cell plug for forming word lines (or word lines and select lines disposed below the word lines). The following description will be focused on differences from the above-mentioned first embodiments.

FIGS. 4A to 4J are sectional views taken along line A-A' illustrated in FIG. 1, to illustrate a method of manufacturing the semiconductor device illustrated in FIG. 1. FIGS. 5A to 5J are top plan views of the drawings illustrated in FIGS. 4A to 4J.

Referring to FIGS. 4A to 4B and 5A to 5B, a first preliminary stack STA1' is formed on a lower structure 201.

The lower structure 201 may include a pipe gate in which a pipe channel is embedded. The lower structure 201 may be a substrate including a source region or a source line. A detailed example of the lower structure 201 will be described later with reference to FIGS. 12 and 13.

The first preliminary stack STA1' includes interlayer insulating layers 211a and sacrificial layers 213a that are alternately stacked. As will be described, the sacrificial layers 213a of the first preliminary stack STA1' may be replaced with conductive line patterns and used as word lines (or word lines and select lines disposed below the word lines).

Cell plugs CP' passing through the first preliminary stack STA1' are formed. The cell plugs CP' may be arranged in a zigzag manner in the row direction I and the column direction II.

The cell plugs CP' may be formed by the steps of: etching the first preliminary stack STA1' and forming first channel holes H1 arranged in a zigzag manner; forming a memory layer (refer to MO of FIG. 1) in each of the first channel holes H1; and forming a channel column (CH of FIG. 1) enclosed by the memory layer in each of the first channel holes H1.

Unlike the above-mentioned first embodiments, in the second embodiments of the present disclosure, the cell plugs CP' passing through the first preliminary stack STA1' are provided before a second preliminary stack STA2' is formed.

Thereafter, the second preliminary stack STA2' is formed on the first preliminary stack STA1' and the cell plugs CP'.

The second preliminary stack STA2' includes interlayer insulating layers 211b and sacrificial layers 213b that are alternately stacked. As will be described later, the sacrificial layers 213b of the second preliminary stack STA2' may be replaced with conductive line patterns and used as select lines, e.g., drain select lines.

Subsequently, referring to FIGS. 4C to 4F and 5C to 5F, a first hard mask layer HM1' is formed on the second preliminary stack STA2'. The first hard mask layer HM1' may include at least one of amorphous carbon, poly silicon, titanium nitride (TiN), tantalum (Ta), titanium (Ti), tungsten (W), an amorphous carbon layer (ACL), silicon oxynitride (SiON), and tetraethyle orthosilicate (TEOS).

Thereafter, a linear trench T2' is formed by etching portion of the first hard mask layer HM1'. Here, the first hard mask layer HM1' provided with the trench T2' refers to a first hard mask pattern HM1P' in the drawings.

The trench T2' may be formed such that a portion of an upper surface of the second preliminary stack STA2' is exposed. The trench T2' overlaps upper ends of the cell plugs CP' arranged in a zigzag manner in the row direction I and the column direction II, and extends in one direction.

A select line separation trench T1' is formed by etching the second preliminary stack STA2' using the first hard mask pattern HM1P' as an etching mask.

The trench T2' overlaps the upper ends of the cell plugs CP' arranged in a zigzag manner and extends in one direction. Thus, when the second preliminary stack STA2' exposed through the trench T2' is etched, the select line separation trench T1' is formed to overlap the upper ends of the cell plugs CP' arranged in a zigzag manner and extend in one direction. In other words, the select line separation trench T1' may have a linear shape. It is preferable that the select line separation trench T1' be formed to expose portions of the upper surfaces of the first preliminary stack STA1' and the cell plugs CP'. Only a portion of each of the cell plugs CP' that are exposed through the select line separation trench T1' is exposed.

In the first embodiments, the select line separation trench T1 has been directly formed in a wave shape using a difference in material between the hard mask layers and, thereafter, the select line separation layer SLS has been formed by filling the select line separation trench T1 with a non-conductor. However, in the second embodiments, a linear select line separation layer SLS' is formed by filling the linear select line separation trench T1' with a non-conductor and, thereafter, the select line separation layer SLS' is processed to have a wave shape using select plugs to be formed on the cell plugs CP'. Therefore, unlike the first embodiments, in the second embodiments, there is no need for an additional hard mask layer made of material different from that of the first hard mask layer HM1.

Subsequently, the first hard mask pattern HM1P' is removed.

Referring to FIGS. 4G to 4I and 5G to 5I, the select line separation layer SLS' is formed by filling the select line separation trench T1' with a non-conductor. As a result, the select line separation layer SLS' passing through the second preliminary stack STA2' is formed.

As described above, since the select line separation trench T1' is disposed to overlap the cell plugs CP' arranged in a zigzag manner and linearly extends in one direction, the select line separation layer SLS' formed by filling the select line separation trench T1' with a non-conductor is also disposed to overlap the upper ends of the cell plugs CP' arranged in a zigzag manner and linearly extends in one direction. The select line separation layer SLS' is disposed to overlap a portion of each of the corresponding cell plugs CP'.

Thereafter, second channel holes H2 through which portions of the upper surfaces of the cell plugs CP' are exposed are formed by etching portion of the select line separation layer SLS' and portion of the second preliminary stack STA2'. The second channel holes H2 are disposed in a zigzag manner. The select line separation layer SLS' penetrated by the second channel holes H2 refers to a select line separation pattern SLSP in the drawings.

The select line separation layer SLS' is disposed to overlap the cell plugs CP' arranged in a zigzag manner, and the select line separation pattern SLSP is also disposed to overlap the cell plugs CP' arranged in a zigzag manner. The select line separation layer SLS' is disposed to overlap a portion of each of the cell plugs CP' that overlap the select line separation layer SLS', and the select line separation pattern SLSP is also disposed to overlap a portion of each of the cell plugs CP' that overlap the select line separation pattern SLSP. Since portion of the select line separation layer SLS' is etched and removed during an etching process for forming the second channel holes H2, the size with which the select line separation pattern SLSP and the cell plugs CP' overlap each other is reduced by the size of the etched and removed portion of the select line separation layer SLS'.

The select line separation pattern SLSP is disposed to pass between the second channel holes H2 that are disposed on the cell plugs CP'.

Subsequently, select plugs CPG which are coupled to the channel columns of the corresponding cell plugs CP' are formed in the respective second channel holes H2. Each select plug CPG may include a channel column, and an insulating layer which encloses the channel column and is formed of a nitride layer or an oxide layer. In this way, the select plugs CPG are formed to pass through the select line separation pattern SLSP and the second preliminary stack STA2' and be coupled to the respective cell plugs CP'. The select plugs CPG may be coupled to the respective cell plugs CP' and arranged in a zigzag manner.

Since the select line separation pattern SLSP is disposed to pass between the second channel holes H2 that are arranged in a zigzag manner, the select line separation pattern SLSP passes between the select plugs CPG that are arranged in a zigzag manner.

Consequently, the select line separation pattern SLSP may have a wave shape.

Figure 4A:
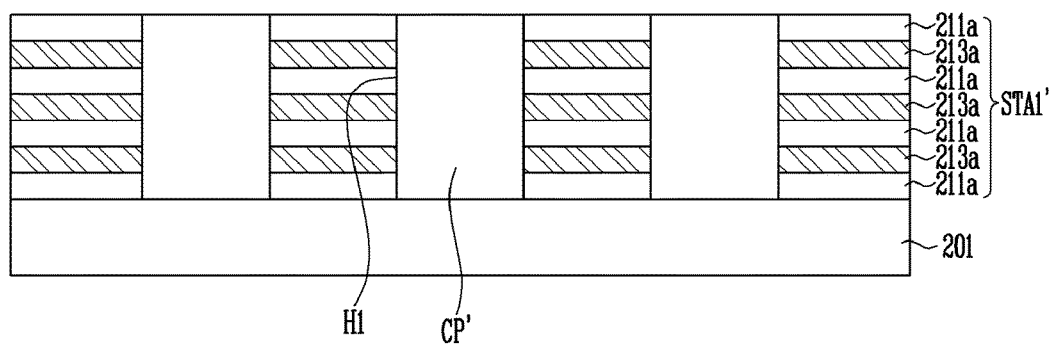
FIGS. 4A to 4J are sectional views taken along line A-A' illustrated in FIG. 1, to illustrate a method of manufacturing the semiconductor device illustrated in FIG. 1.
Figure 4B:
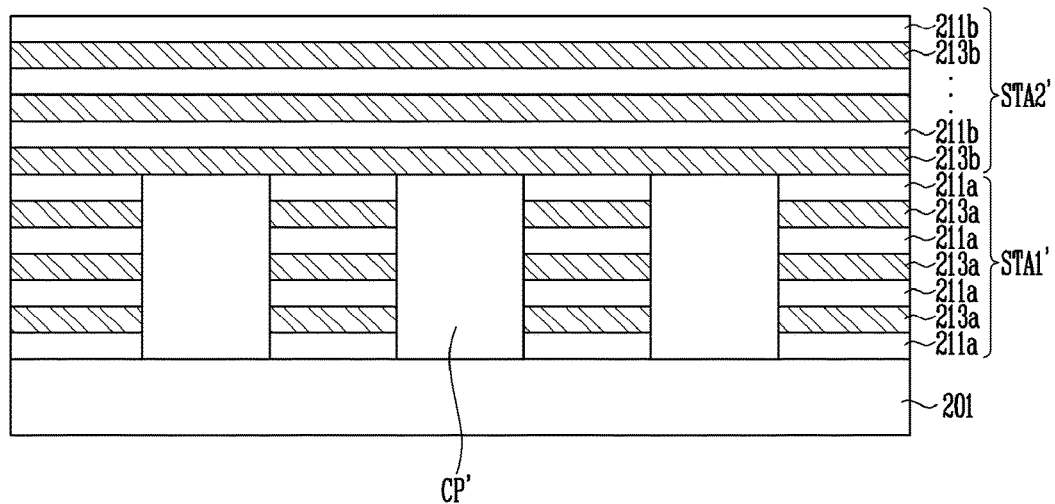
Figure 4C:
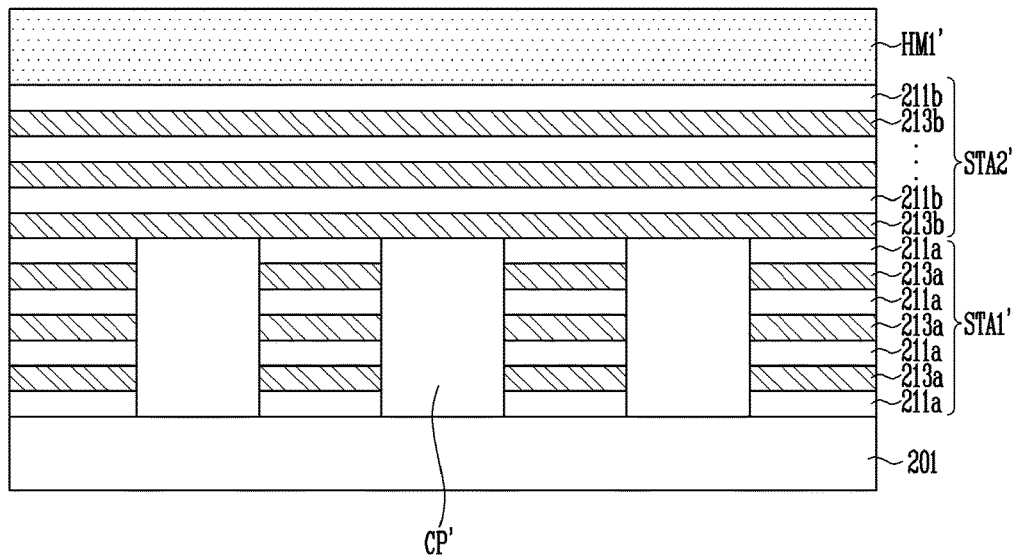
Figure 4D:
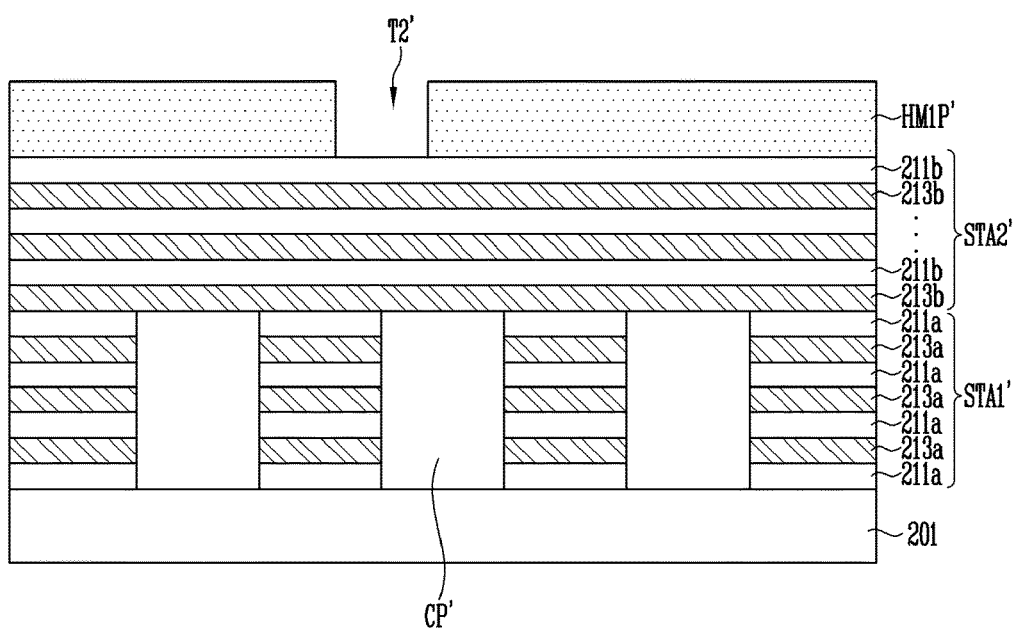
Figure 4E:
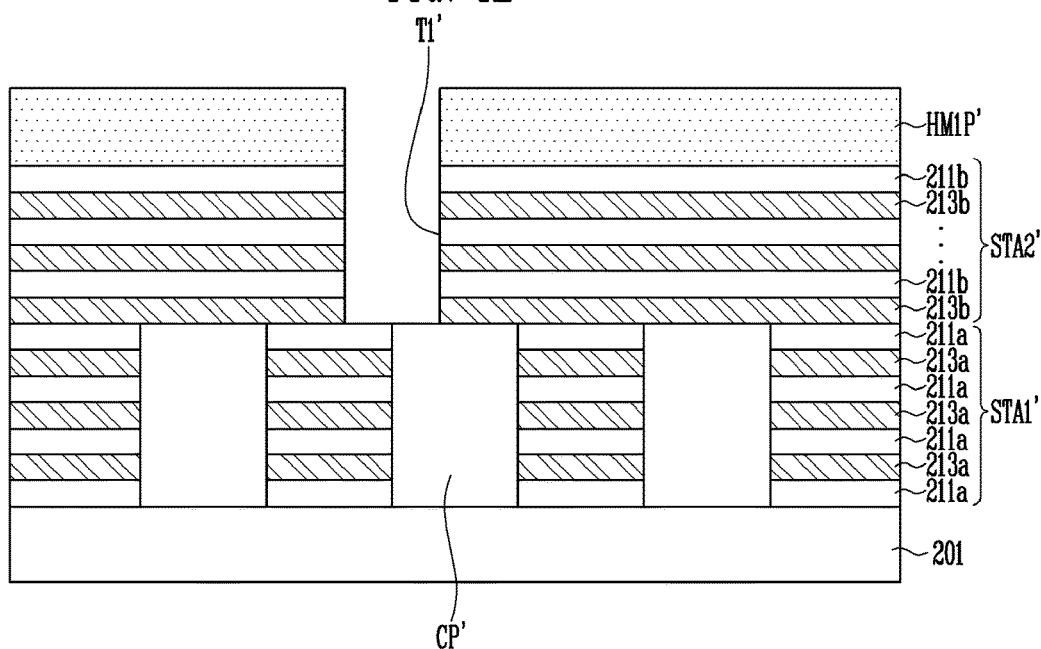
Figure 4F:
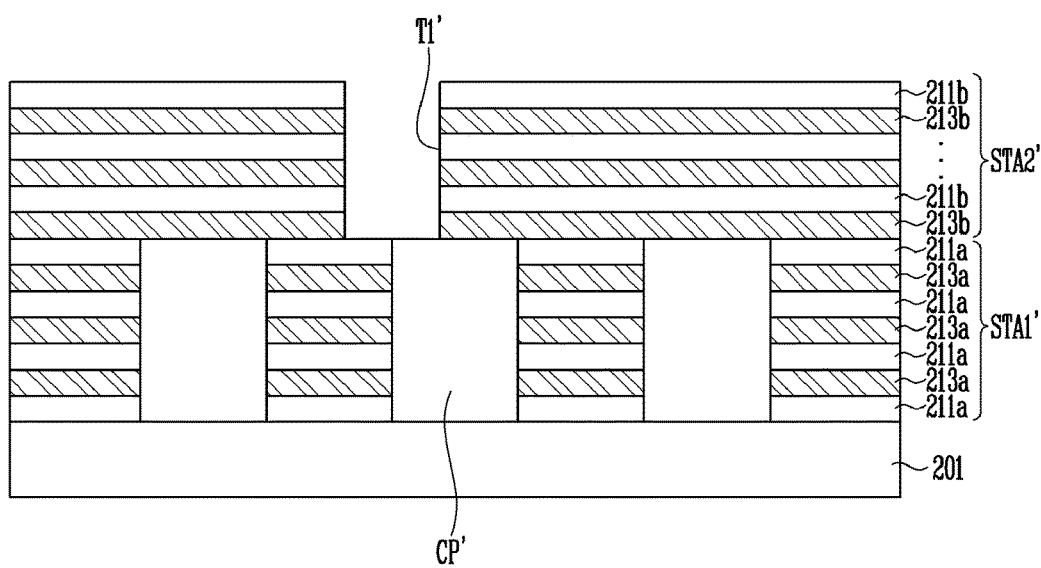
Figure 4G:
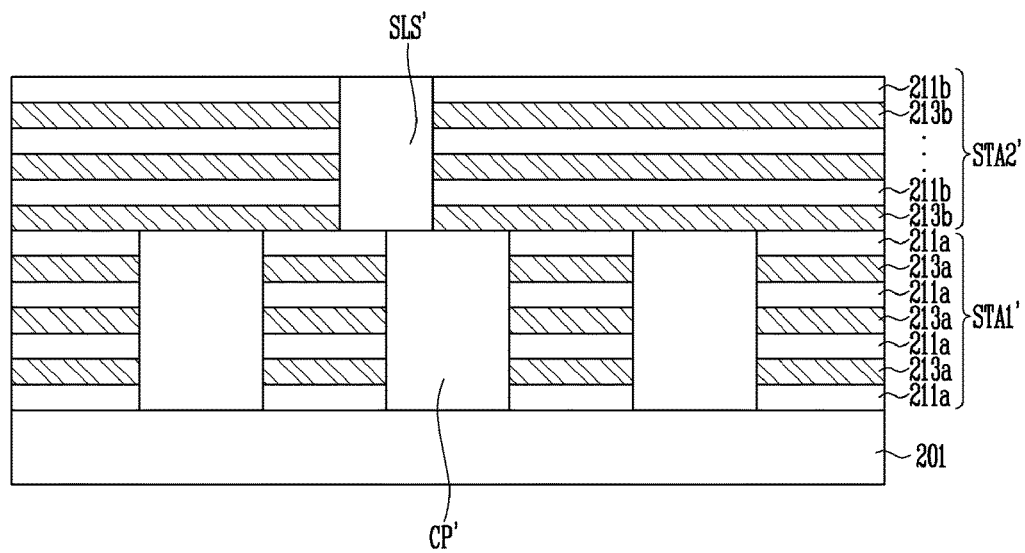
Figure 4H:
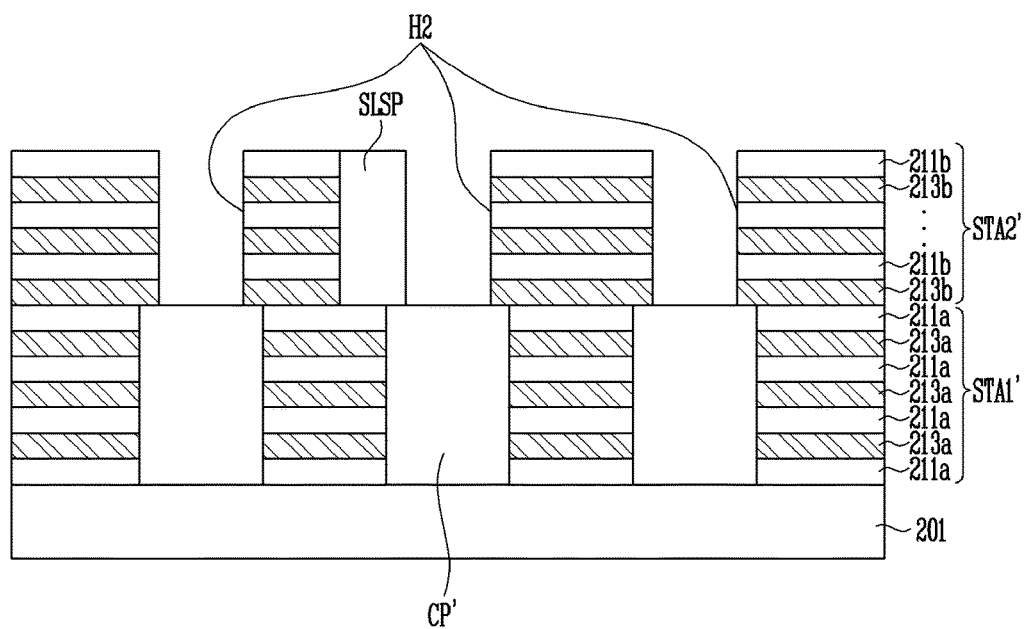
Figure 4I:
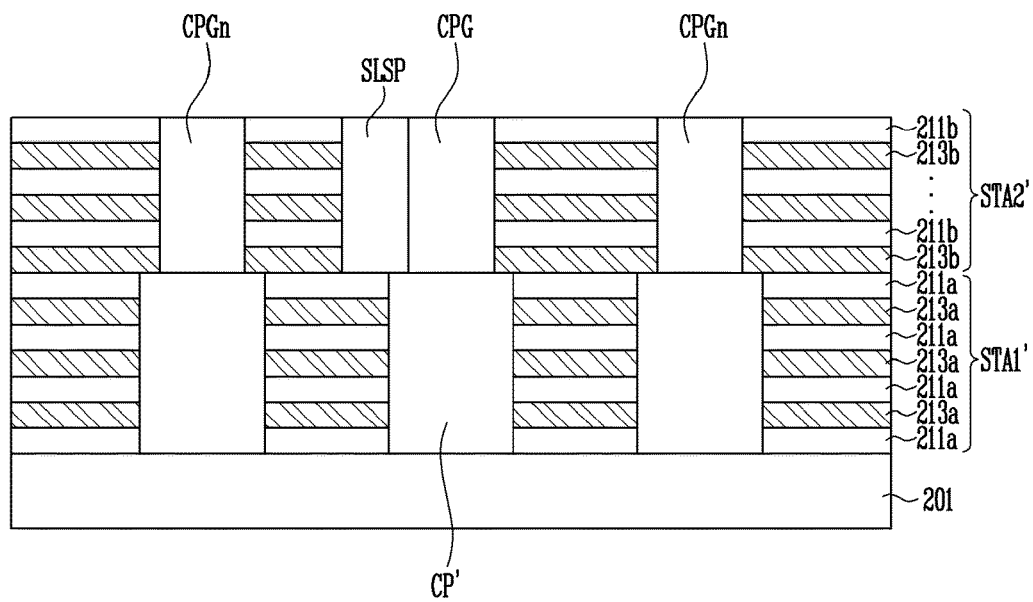
Figure 4J:
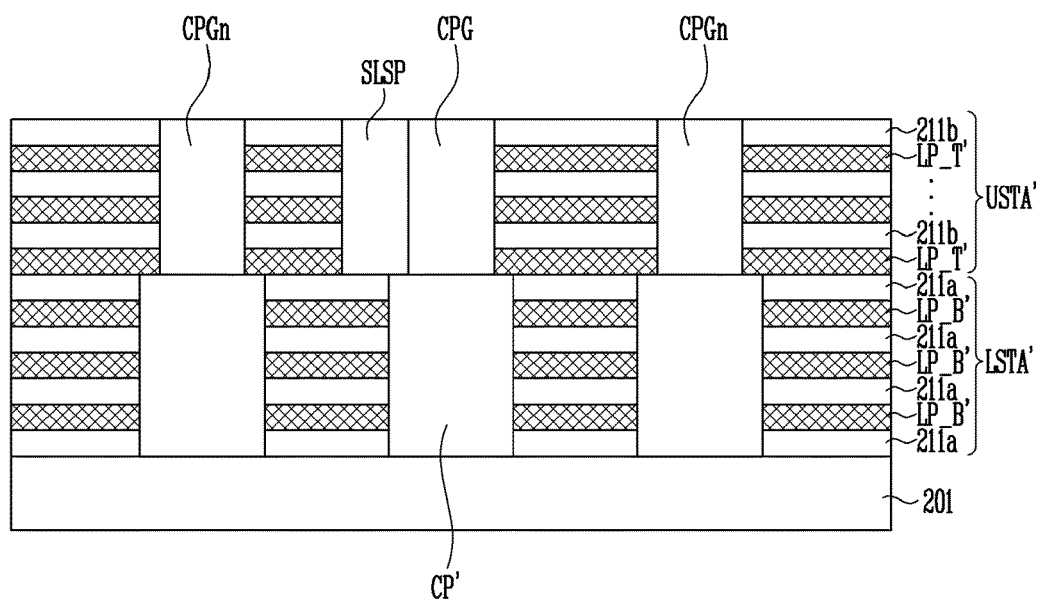
Figure 5A:
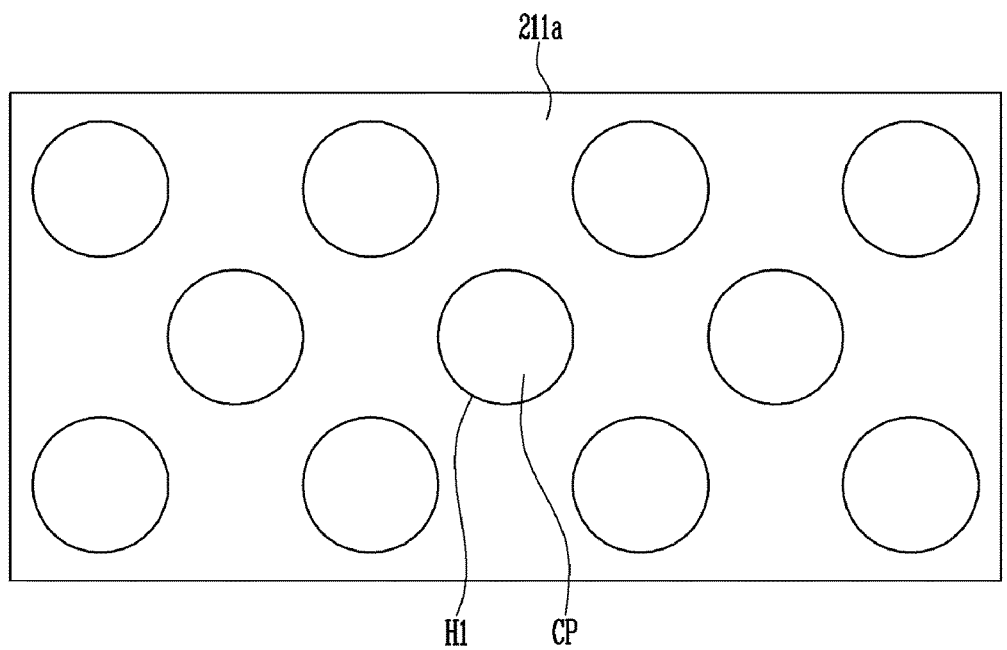
FIGS. 5A to 5J are top plan views of the drawings illustrated in FIGS. 4A to 4J.
Figure 5B:
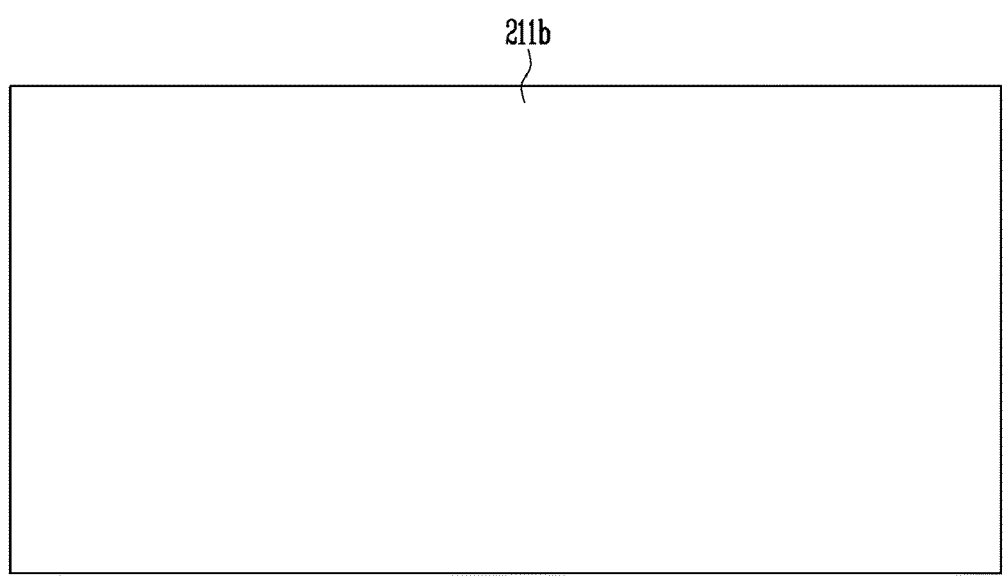
Figure 5C:
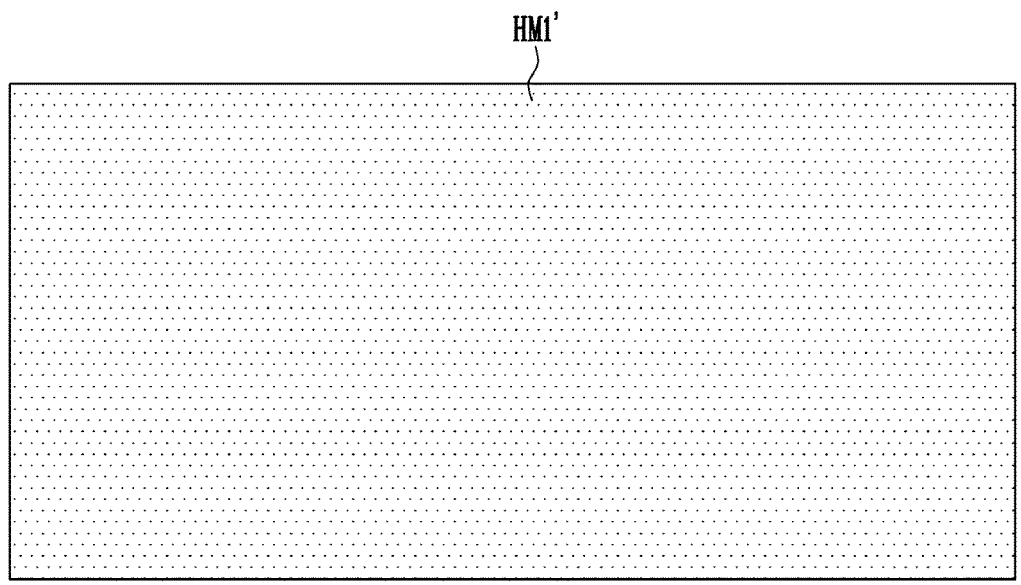
Figure 5D:
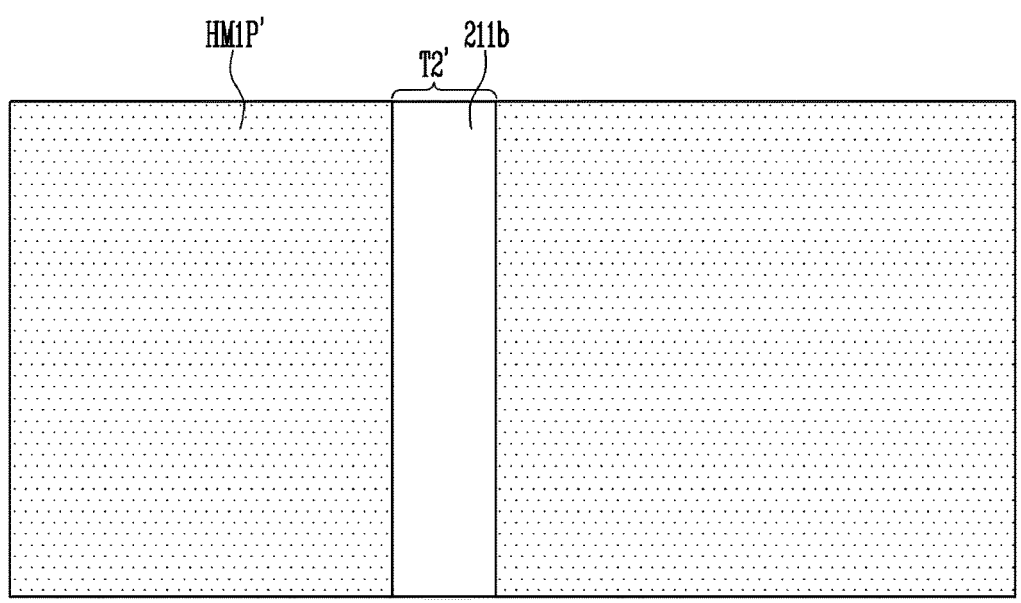
Figure 5E:
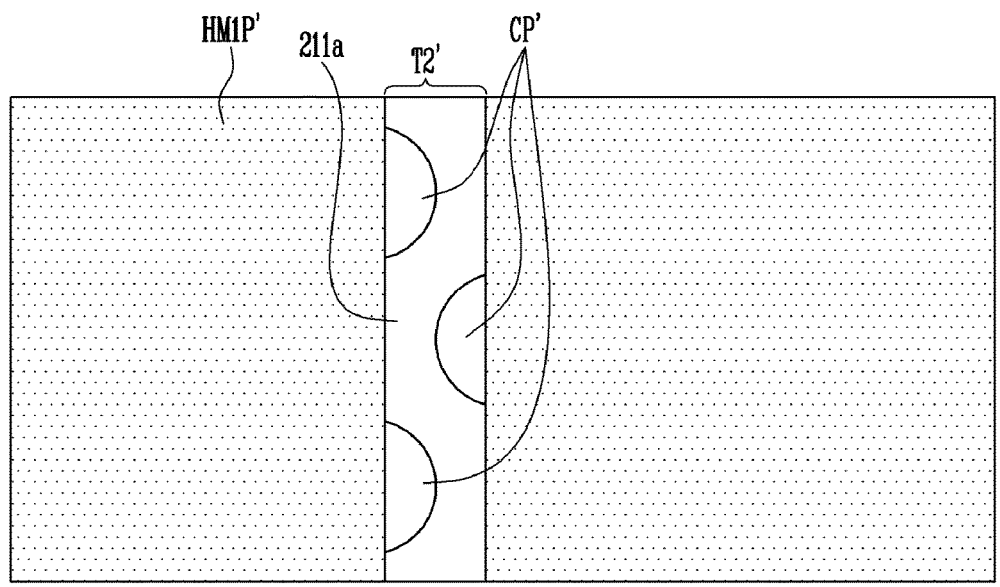
Figure 5F:
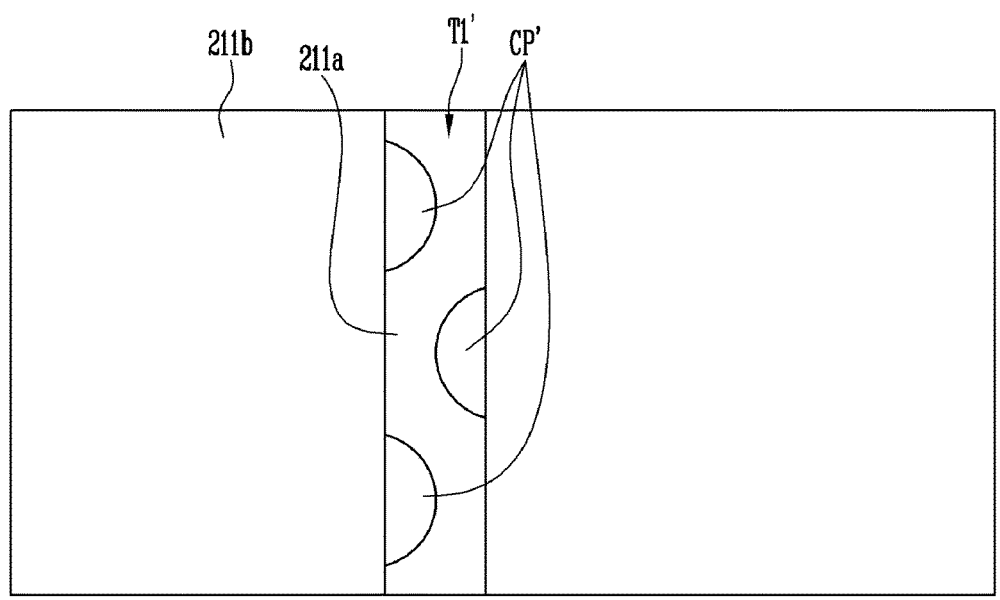
Figure 5G:
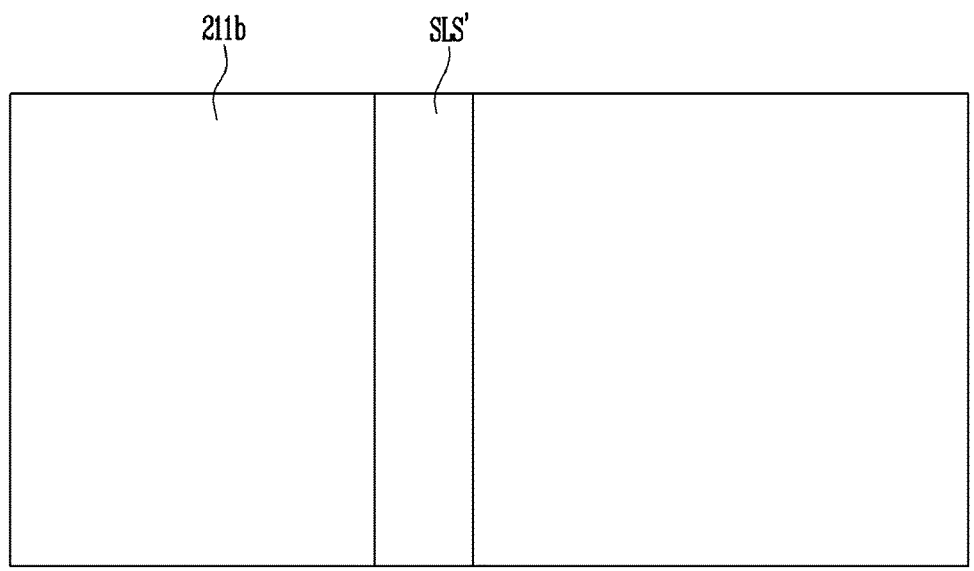
Figure 5H:
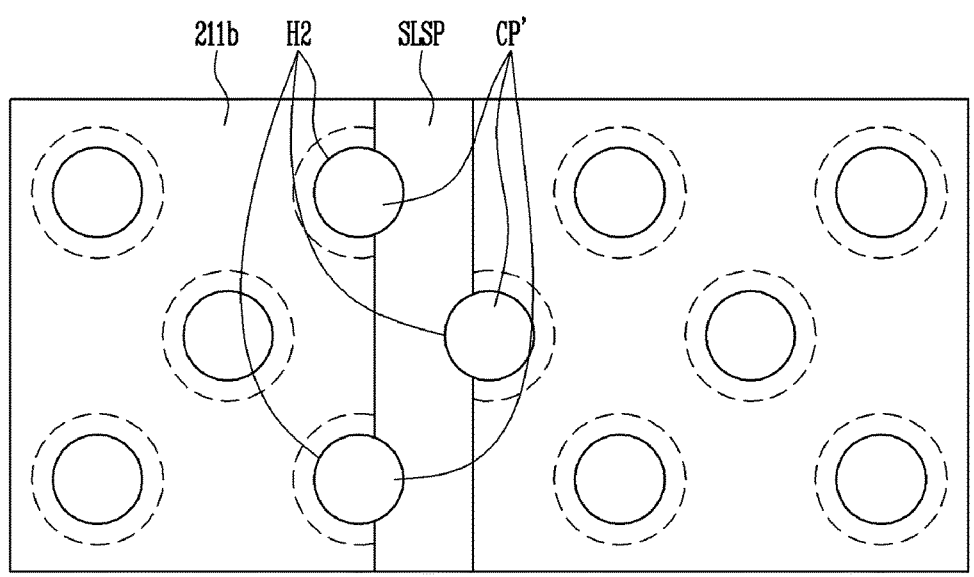
Figure 5I:
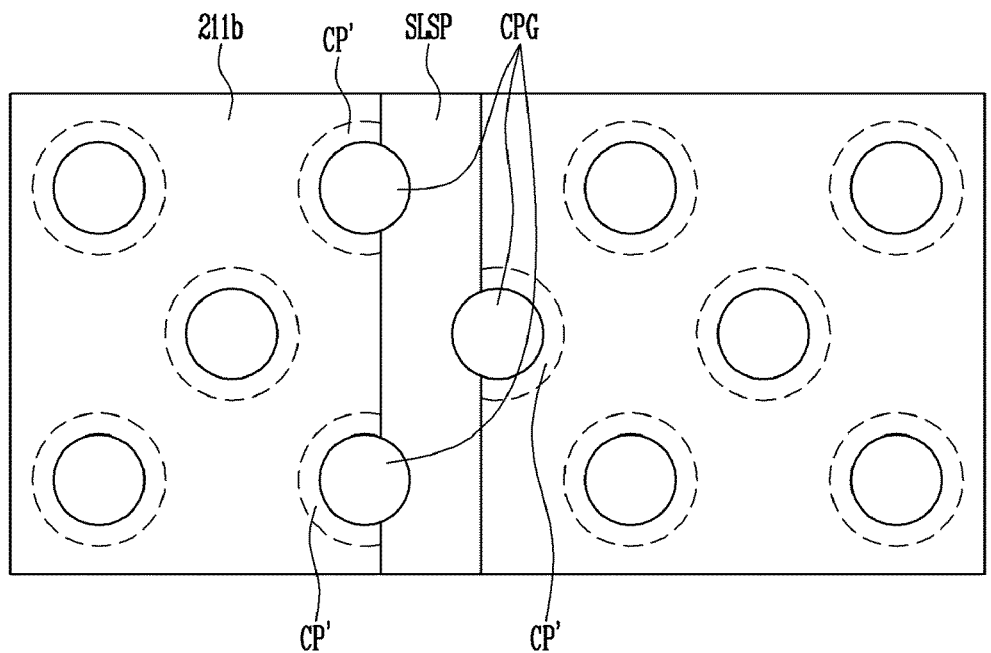
Figure 5J:
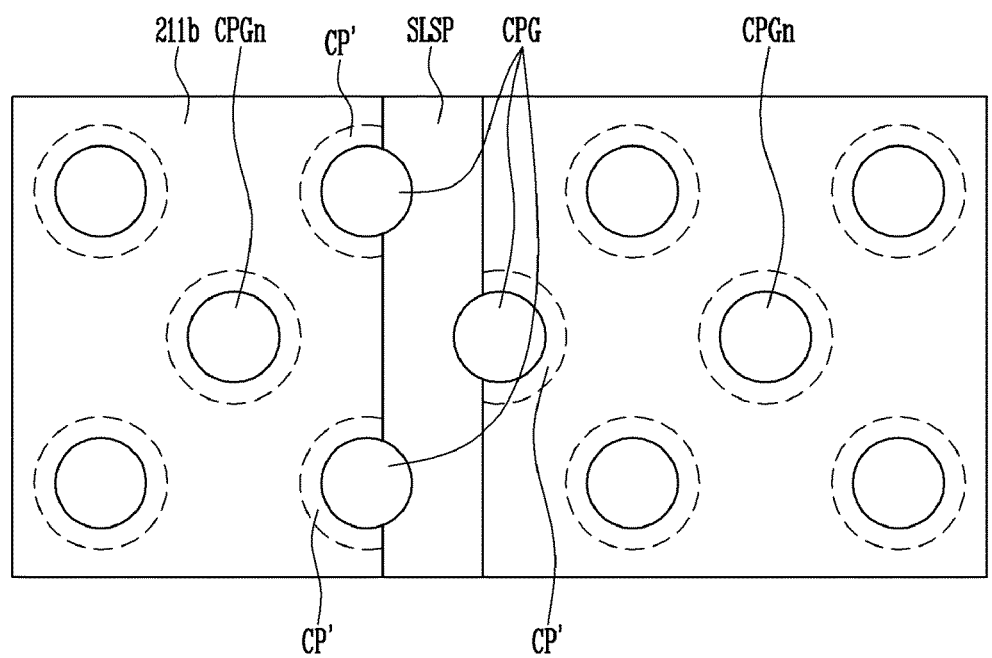

Thereafter, as illustrated in FIGS. 4J and 5J, the sacrificial layers 213a and 213b of the first and second preliminary stacks STA1' and STA2' are replaced with conductive line patterns LP_B' and LP_T'. For this, slits (SI of FIG. 1) may be formed to pass through the first and second preliminary stacks STA1' and STA2, and the sacrificial layers 213a and 213b of the first and second preliminary stacks STA1' and STA2' exposed through the slits may be removed and replaced with the conductive line patterns LP_B' and LP_T'. The lower stack LSTA' is formed by replacing the sacrificial layers 213a of the first preliminary stack STA1' with the conductive line patterns LP_B'. The upper stack USTA' is formed by replacing the sacrificial layers 213b of the second preliminary stack STA2' with the conductive line patterns LP_T'.

In this way, in the second embodiments of the present disclosure, after the cell plugs CP' have been formed, the linear select line separation layer SLS' is processed to have a wave shape using the select plugs CPG that are coupled to the respective cell plugs CP', whereby the select line separation pattern SLSP is formed.

Because the select plug CPG according to the second embodiments of the present disclosure passes through the select line separation layer SLS, the area with which the select plugs CPG is enclosed by the conductive line patterns LP_T' is less than that of the other select plugs CPGn that do not pass through the select line separation layer SLS', in other words, pass through only the upper stack USTA'. For example, while the entirety of the outer circumferential surface of the select plug CPGn is enclosed by the conductive line patterns LP_T, only three-fourth of the outer circumferential surface of the select plug CPG may be enclosed by the conductive line patterns LP_T'. The other one-fourth of the outer circumferential surface of the select plug CPG may be enclosed by the select line separation pattern SLSP. This structure may affect on/off characteristics between the select plugs CPG and CPGn.

Therefore, the select line separation pattern SLSP according to the second embodiments of the present disclosure may include a sidewall covered with a conductive material pattern.

FIGS. 6A to 6E are sectional views illustrating an embodiment in which a select line separation pattern SLSP' includes a sidewall covered with a conductive material pattern 220b. FIGS. 7A to 7E are top plan views of the drawings illustrated in FIGS. 6A to 6E. The same descriptions as those of FIGS. 4A to 4F and 5A to 5F according to the second embodiments may be given. FIGS. 6A to 6E correspond to the steps after FIG. 4F, and FIGS. 7A to 7E correspond to the steps after FIG. 5F. The following description will be focused on differences from the above-mentioned second embodiments.

Referring to FIGS. 6A to 6C and 7A to 7C, a conductive material layer 220 is formed on the entire structure provided with the select line separation trench T1'. The conductive material layer 220 may include a titanium nitride layer (TiN), a tantalum nitride layer (TaN), tungsten (W), or the like. However, the present disclosure is not limited to this.

Subsequently, the conductive material layer 220 is etched to expose a portion of the upper surface of the second preliminary stack STA2'. Furthermore, the conductive material layer 220 is etched to expose a portion of an upper surface of the first preliminary stack STA1' and a portion of the upper surface of the cell plugs CP' through the select line separation trench T1'. In other words, an etching process is performed such that the conductive material layer 220 remains on only the sidewall of the select line separation trench T1'. For this, a vertical etching method may be used. The etched conductive material layer 220 refers to a first conductive material pattern 220a in the drawings.

Because the select line separation trench T1' is disposed to overlap the upper ends of the cell plugs CP' arranged in a zigzag manner, the first conductive material pattern 220a formed in the select line separation trench T1' is disposed to overlap the cell plugs CP' arranged in a zigzag manner.

Thereafter, the select line separation trench T1' is filled with a non-conductor to form a select line separation layer SLS". Compared to the above-mentioned select line separation layer SLS' of FIGS. 4G and 5G, the select line separation layer SLS" has a reduced width because the first conductive material pattern 220a is present. However, the select line separation layer SLS" may be regarded as being the same as the select line separation layer SLS' in that select line separation layer SLS" is disposed to overlap a portion of each of the corresponding cell plugs CP'.

Referring to FIGS. 6D to 6E and 7D to 7E, the second channel holes H2 arranged in a zigzag manner are formed by etching the select line separation layer SLS", the first conductive material pattern 220a and the second preliminary stack STA2'. Portions of the upper surfaces of the cell plugs CP' are exposed through the respective second channel holes H2. The first conductive material pattern 220a etched through the etching process for forming the second channel holes H2 refers to a second conductive material pattern 220b in the drawings, and the select line separation layer SLS" etched through the etching process refers to the select line separation pattern SLSP" in the drawings.

The select line separation pattern SLSP" is disposed to pass between the second channel holes H2 that are disposed on the cell plugs CP'.

Subsequently, the select plugs CPG which are coupled to the channel columns of the corresponding cell plugs CP' are formed in the respective second channel holes H2. In this way, the select plugs CPG are formed to pass through the select line separation layer SLS", the first conductive material pattern 220a and the second preliminary stack STA2' and be coupled to the respective cell plugs CP'.

Thereafter, the sacrificial layers 213a and 213b of the first and second preliminary stacks STA1' and STA2' are respectively replaced with the conductive line patterns LP_B' and LP_T'.

Figure 6A:
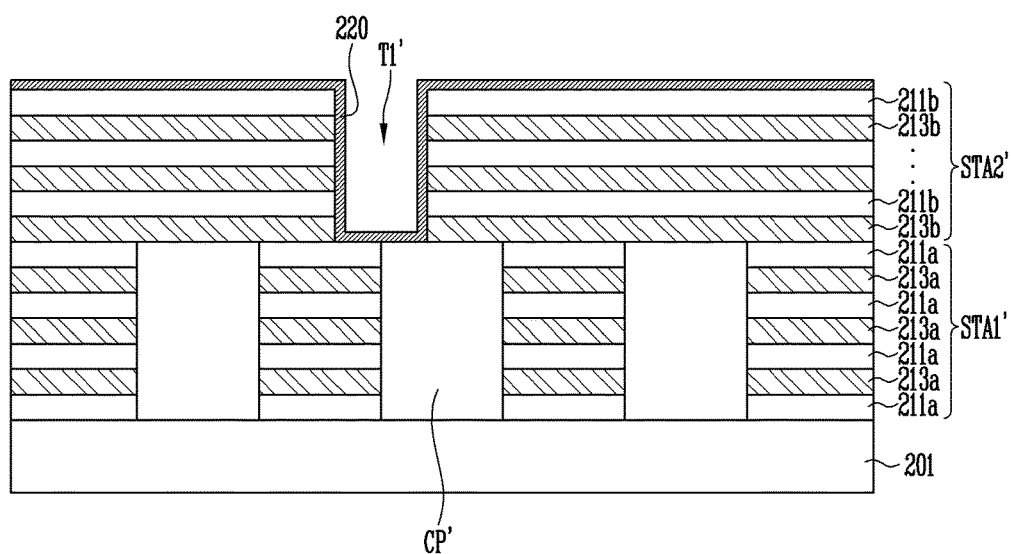
FIGS. 6A to 6E are sectional views illustrating an embodiment in which a select line separation pattern includes a sidewall covered with a conductive material pattern.
Figure 6B:
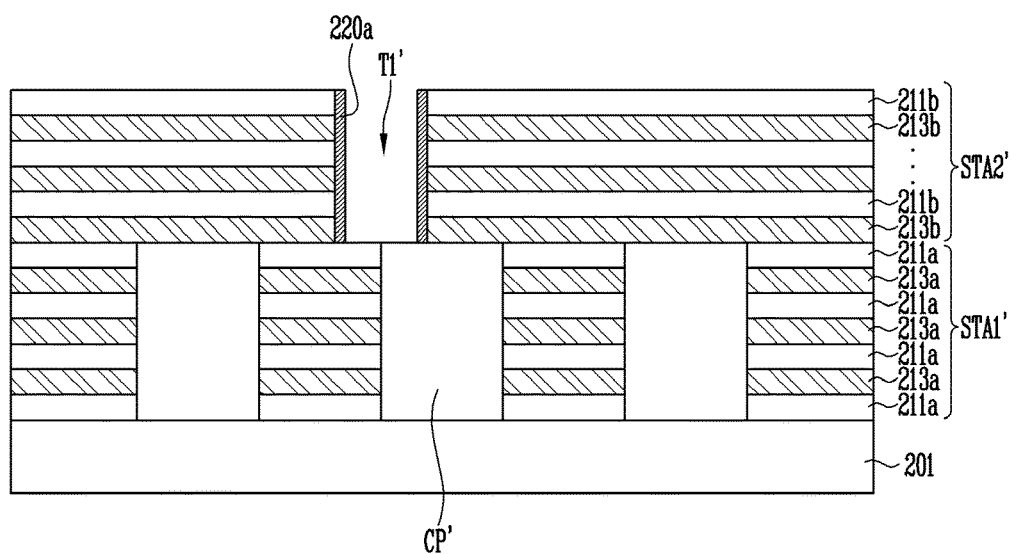
Figure 6C:
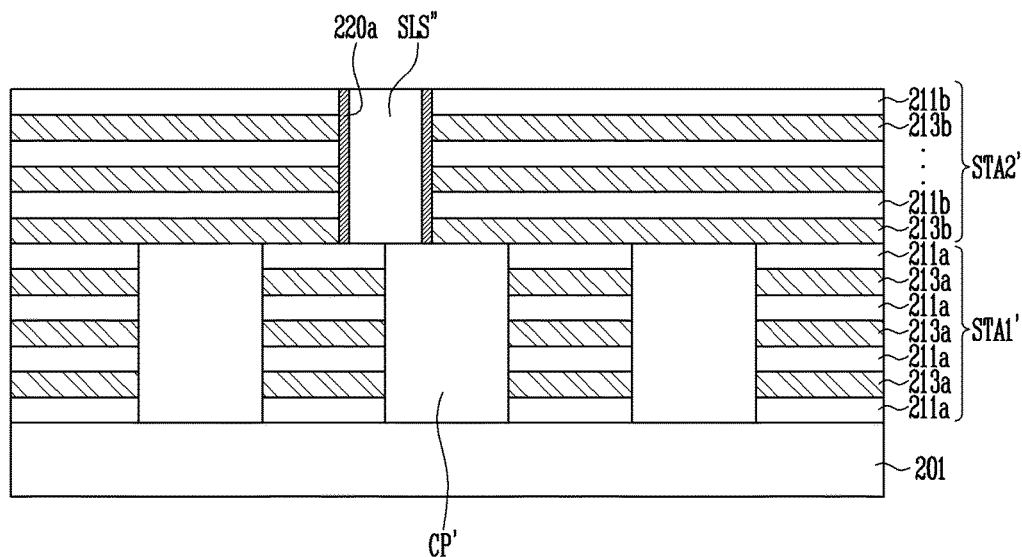
Figure 6D:
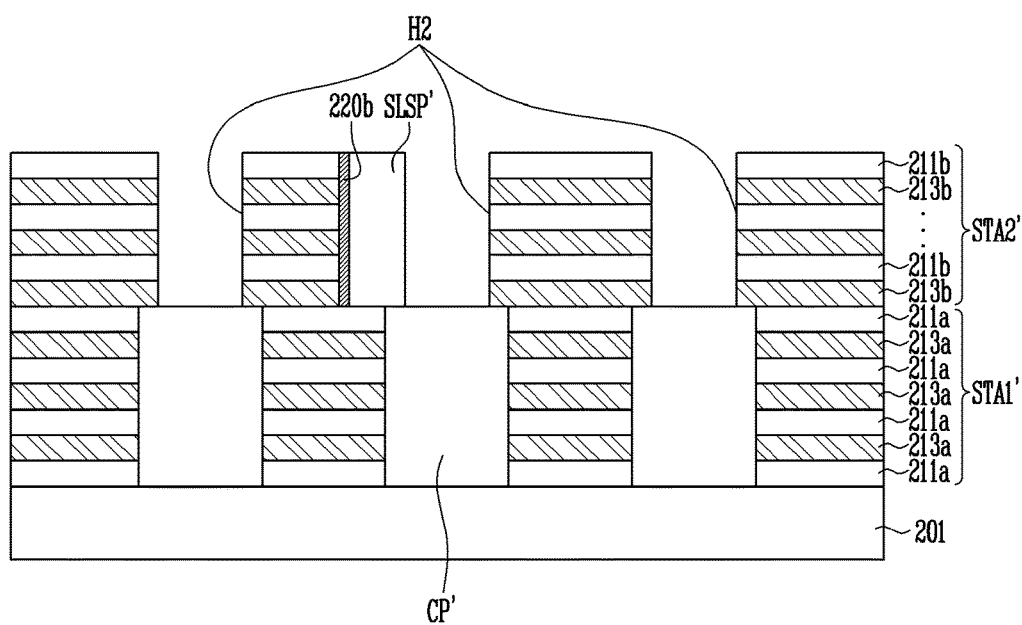
Figure 6E:
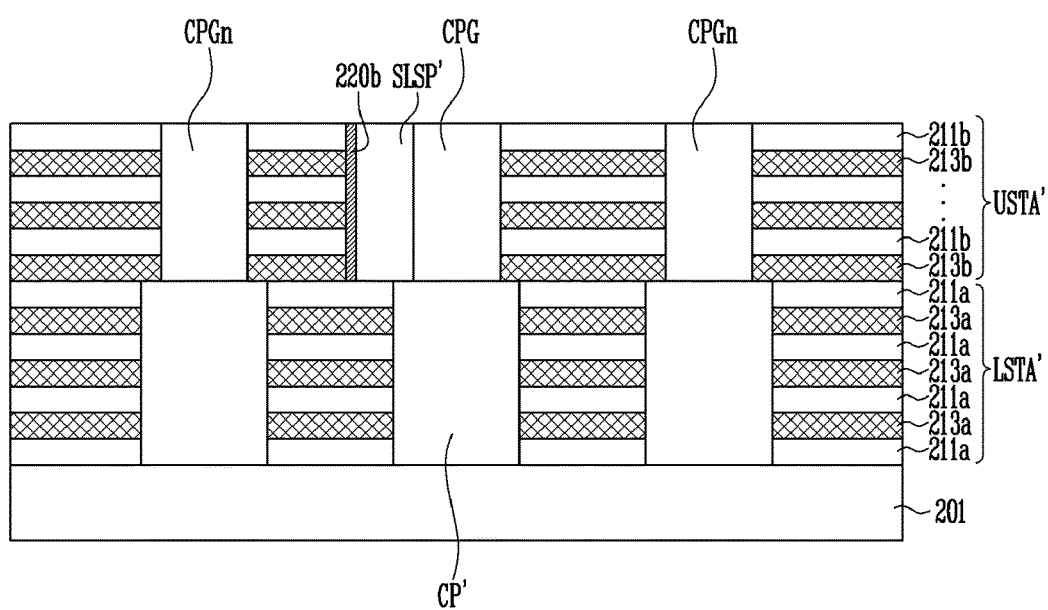
Figure 7A:
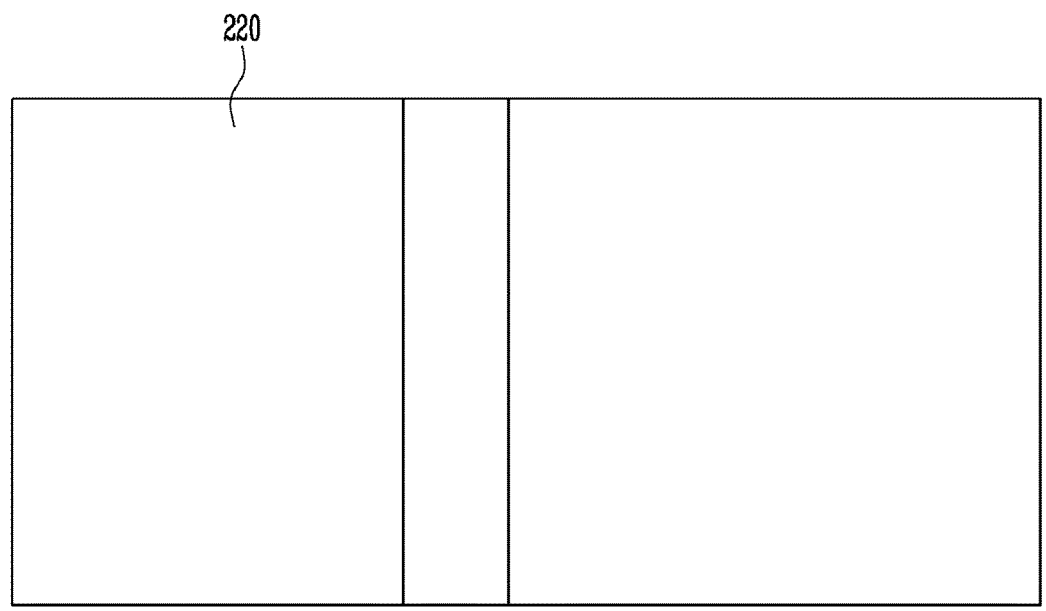
FIGS. 7A to 7E are top plan views of the drawings illustrated in FIGS. 6A to 6E.
Figure 7B:
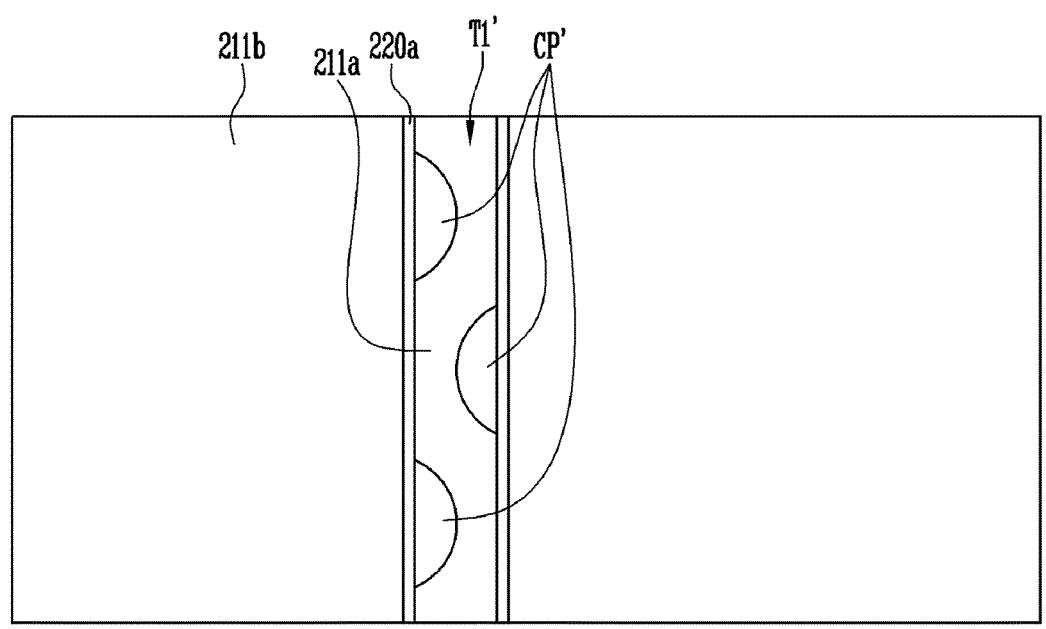
Figure 7C:
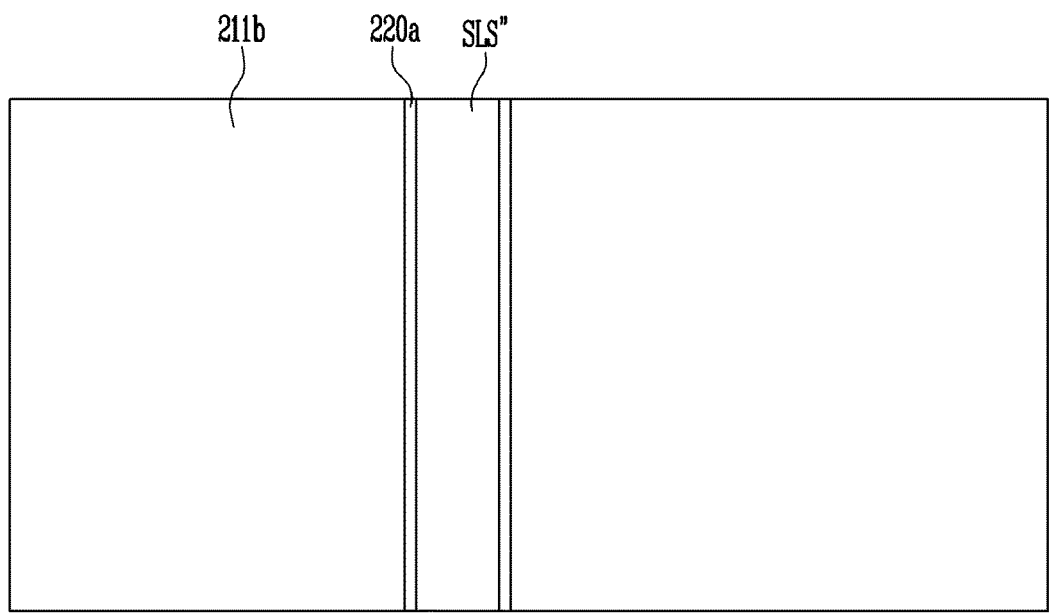
Figure 7D:
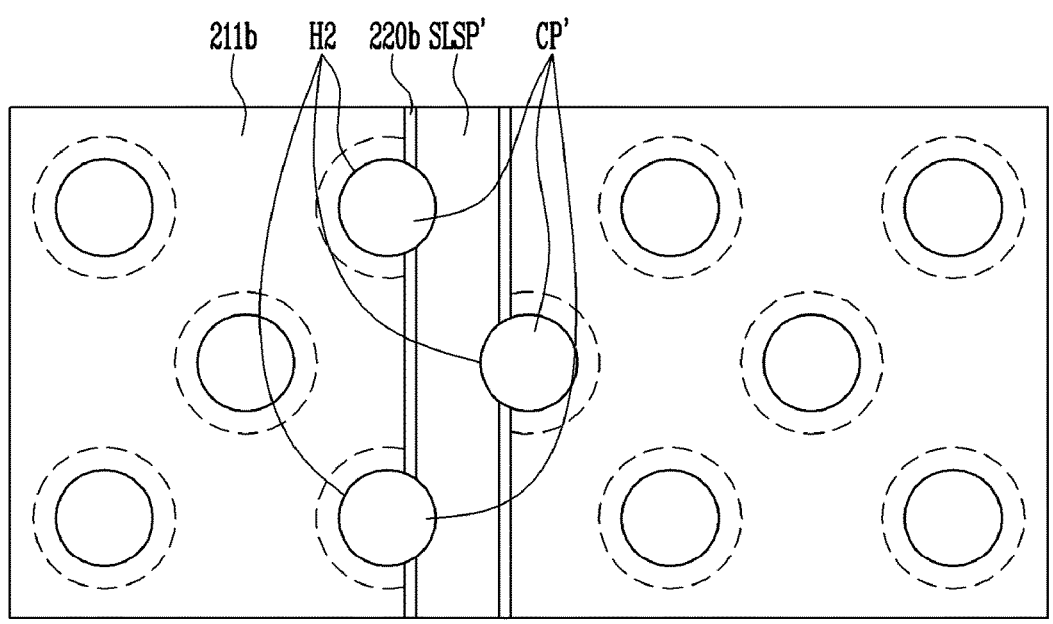
Figure 7E:
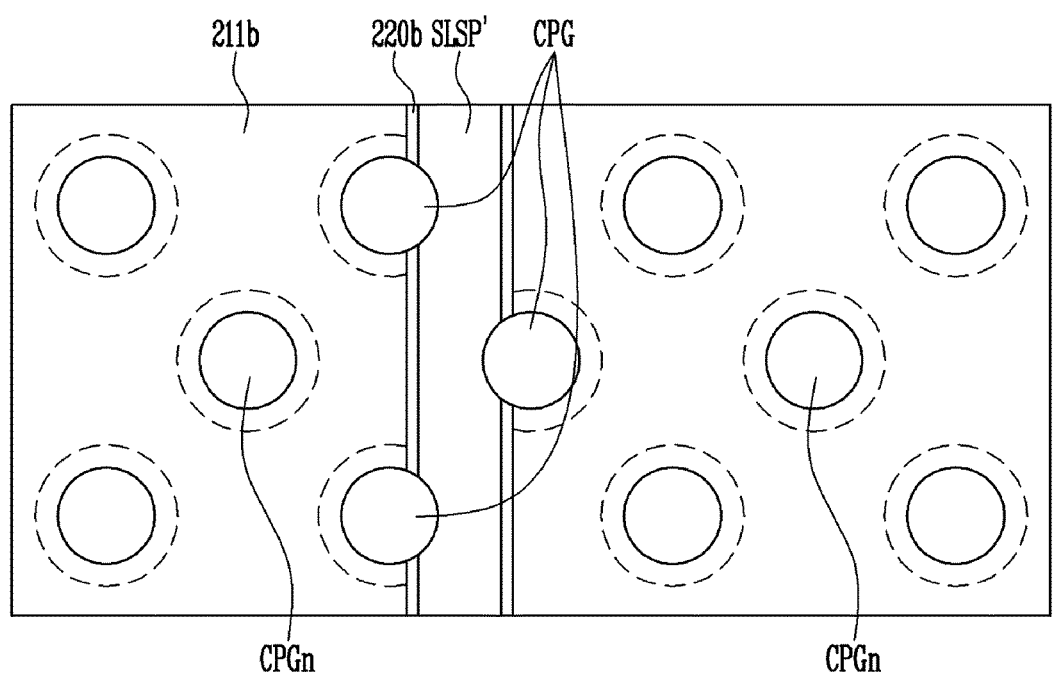

As illustrated in FIGS. 6E and 7E, there are the select plug CPG that passes through the select line separation layer SLS", and the select plug CPGn that passes through only the second preliminary stack STA2' without passing through the select line separation layer SLS. Unlike the select plugs CPG and CPGn of FIGS. 4J and 5J, the select plug CPG is enclosed by the second conductive material pattern 220b, so that a difference in on/off characteristics between the select plugs CPG and CPGn may be reduced.

Figure 8A:
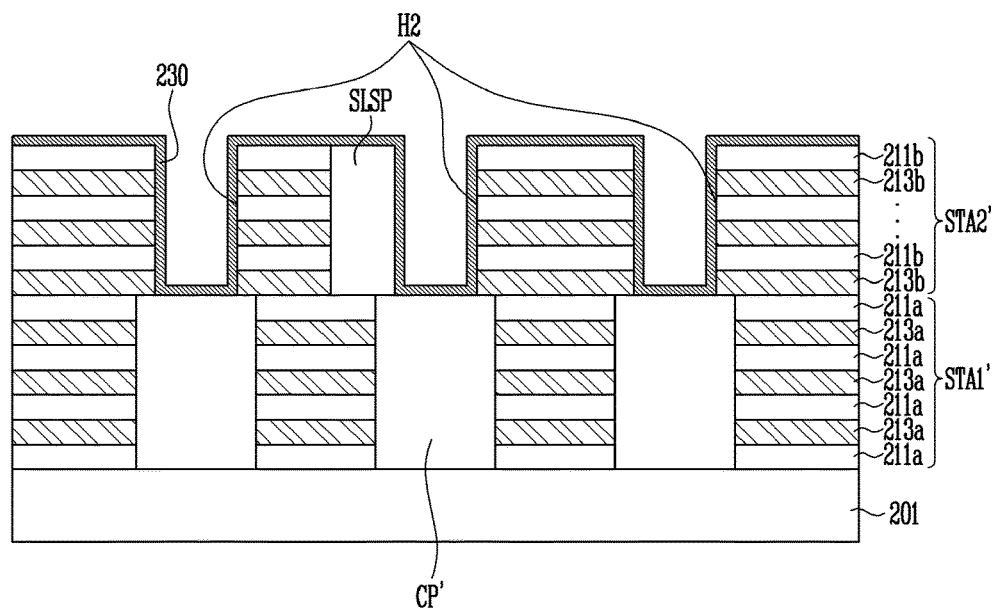
FIGS. 8A to 8C are sectional views illustrating an embodiment in which a select line separation pattern includes a sidewall covered with a conductive material pattern.
Figure 8B:
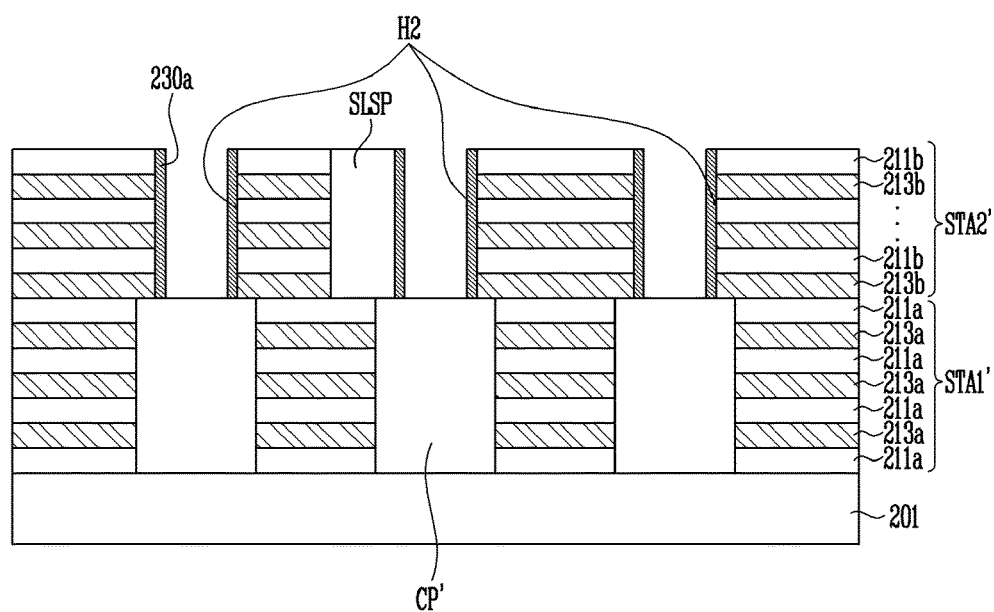
Figure 8C:
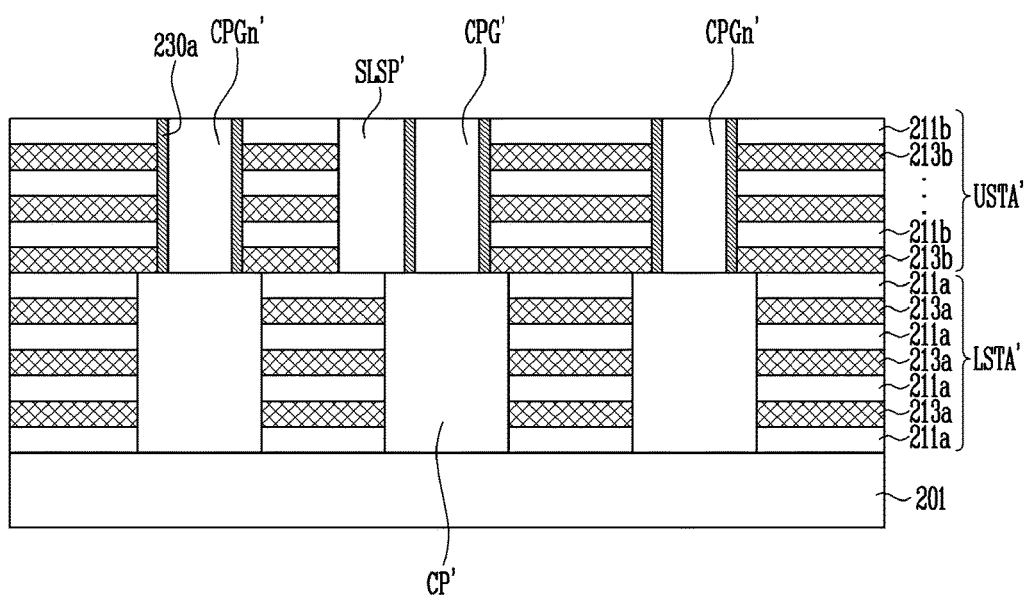
Figure 9A:
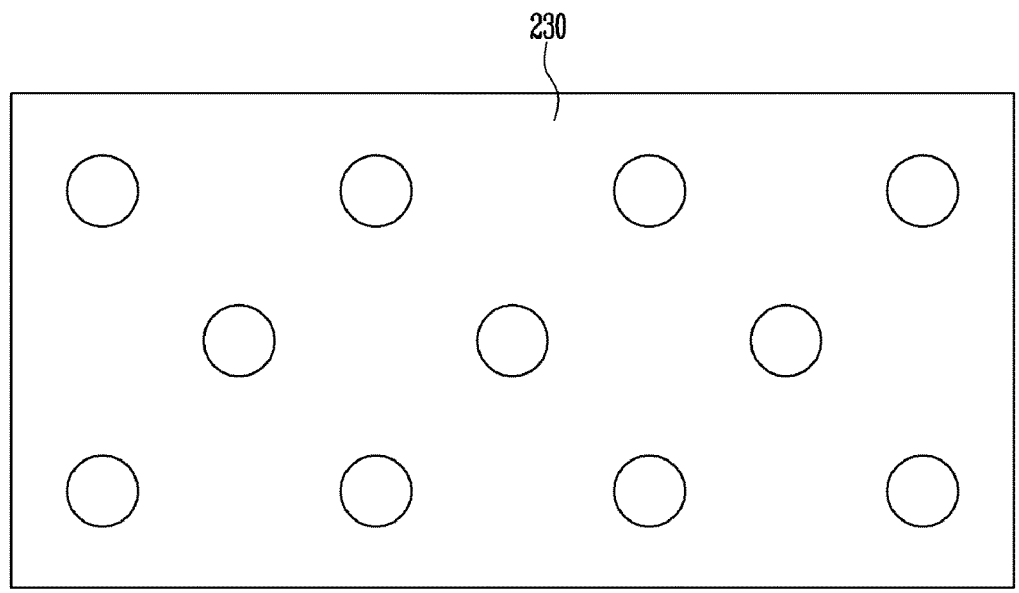
Figure 9B:
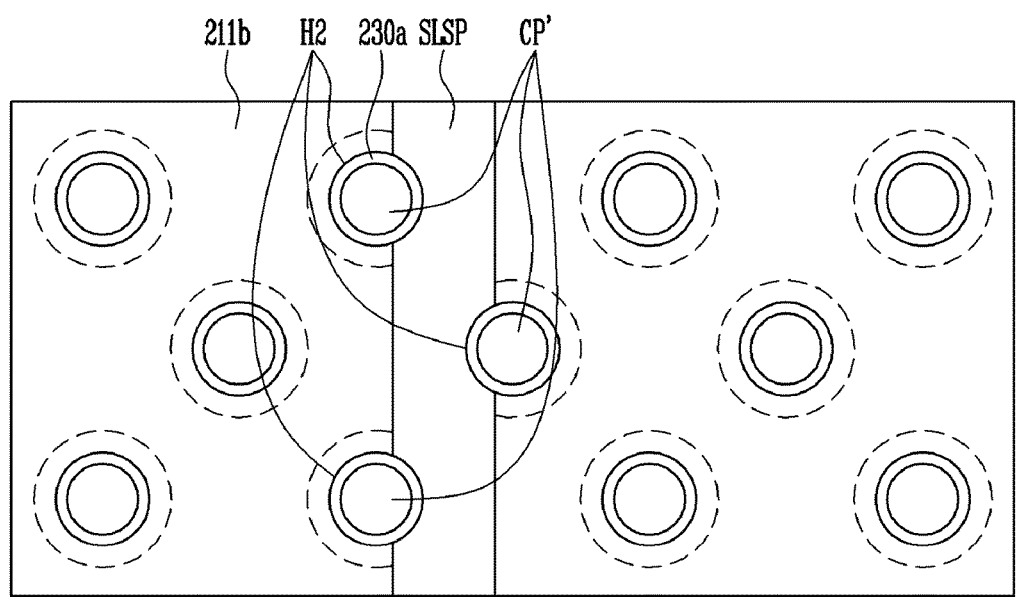

FIGS. 8A to 8C are sectional views illustrating an embodiment in which the select line separation pattern SLSP includes a sidewall covered with a conductive material pattern 230a. FIGS. 9A to 9C are top plan views of the drawings illustrated in FIGS. 8A to 8C. The same descriptions as those of FIGS. 4A to 4H and 5A to 5H according to the second embodiments may be used. FIGS. 8A to 8C correspond to the steps after FIG. 4H, and FIGS. 9A to 9C correspond to the steps after FIG. 5H. The following description will be focused on differences from the above-mentioned second embodiments.

Referring to FIGS. 8A to 8C and 9A to 9C, a conductive material layer 230 is formed on the entire structure provided with the second channel holes H2. The conductive material layer 230 may include a titanium nitride layer (TiN), a tantalum nitride layer (TaN), tungsten (W), or the like.

Subsequently, the conductive material layer 230 is etched to expose a portion of the upper surface of the second preliminary stack STA2'. Furthermore, the conductive material layer 230 is etched to expose the cell plugs CP' through the respective second channel holes H2. In other words, the conductive material layer 230 is etched such that the conductive material layer 230 remains on only the sidewalls of the second channel holes H2. The process of etching the conductive material layer 230 may be performed in a vertical etching method. The etched conductive material layer 230 refers to the conductive material pattern 230a in the drawings.

Subsequently, channel columns which are coupled with the channel columns of the corresponding cell plugs CP' are formed in the respective second channel holes H2, each of which has the conductive material patterns 230a on the sidewall thereof. Thereby, select plugs CPG' are formed. Since not only the select plugs CPG' but also the conductive material patterns 230a are formed in the second channel holes H2, the widths of the select plugs CPG' and CPGn' are less than those of the select plugs CPG and CPGn described with reference to FIGS. 6E and 7E.

Thereafter, the sacrificial layers 213a and 213b of the first and second preliminary stacks STA1' and STA2' are respectively replaced with the conductive line patterns LP_B' and LP_T'.

As illustrated in FIGS. 8E and 9E, there are the select plugs CPG' that are formed in the second channel holes H2 passing through the select line separation layer SLS' and the second preliminary stack STA2, and the select plugs CPGn' that are formed in the second channel holes H2 passing through only the second preliminary stack STA2'. Unlike the select plugs CPG and CPGn of FIGS. 4J and 5J, the conductive material patterns 230a enclose the select plugs CPG' and CPGn', so that a difference in on/off characteristics between the select plugs CPG' and CPGn' disposed at different positions may be reduced.

As such, the select line separation pattern SLSP' in accordance with the second embodiments of the present disclosure may include the sidewall covered with the conductive material pattern 230a. This structure may reduce a difference in on/off characteristics between the select plugs CPG' and CPGn', thus enhancing the operational reliability of the semiconductor memory device.

Also, in the semiconductor device according to the above-mentioned first embodiments of the present disclosure, a conductive material pattern may be formed to reduce a difference in on/off characteristics between the plugs CP.

Figure 10:
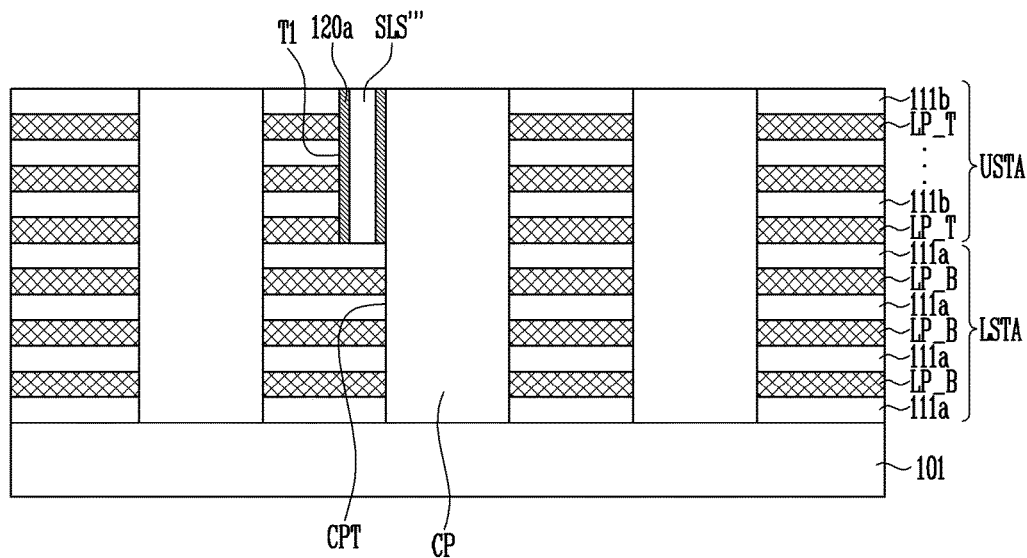
FIG. 10 is a sectional view illustrating an embodiment in which a select line separation layer includes a sidewall covered with a conductive material pattern.
Figure 11:
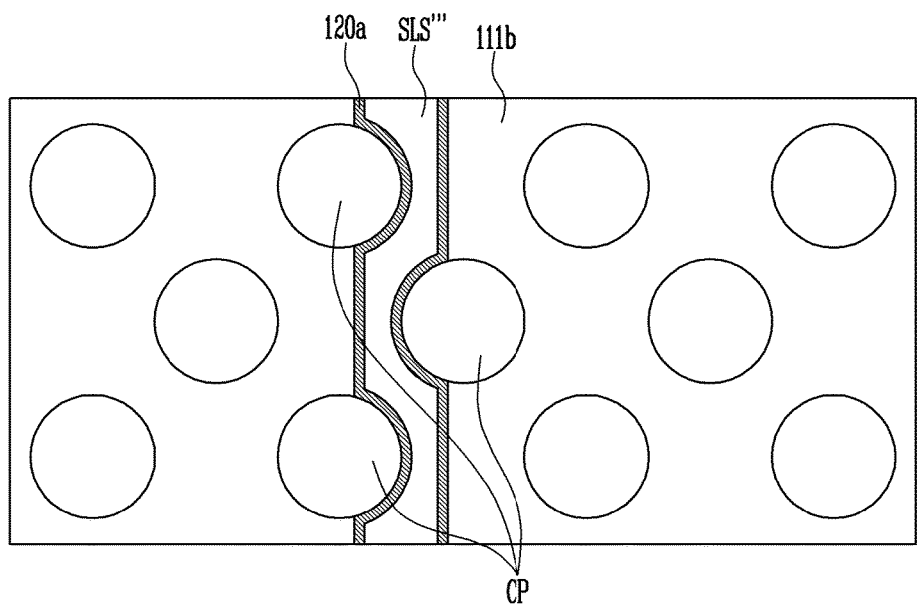
FIG. 11 is a top plan view of the drawing illustrated in FIG. 10.

FIGS. 10 and 11 illustrate embodiments in which the select line separation layer includes a sidewall covered with a conductive material pattern, in the semiconductor device according to the first embodiments of the present disclosure. FIG. 10 is a sectional view illustrating an embodiment in which the select line separation layer includes a sidewall covered with a conductive material pattern, in the semiconductor device according to the first embodiments of the present disclosure. FIG. 11 is a top plan view of the drawing illustrated in FIG. 10.

Figure 2L:
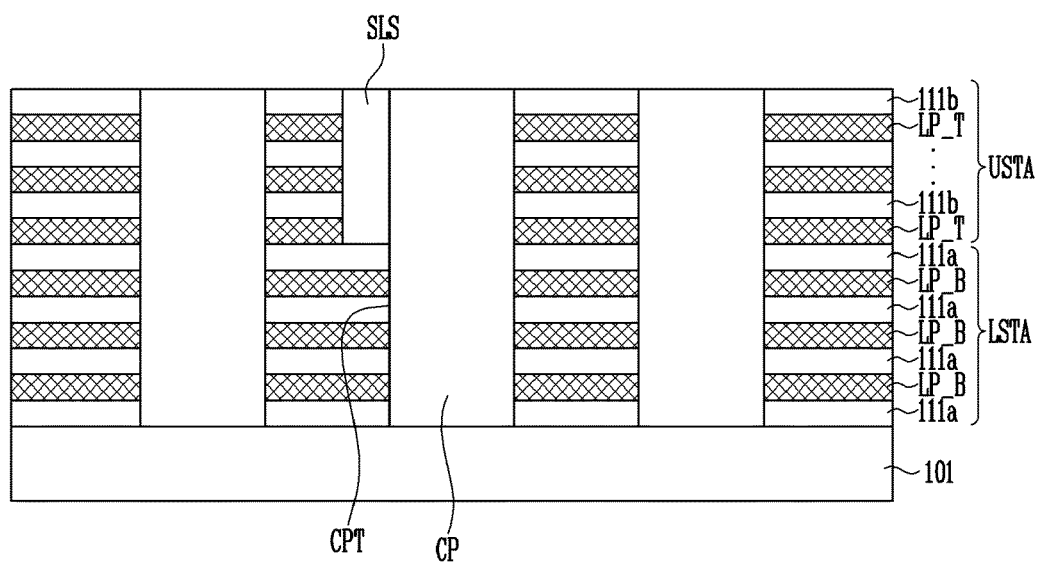
Figure 3L:
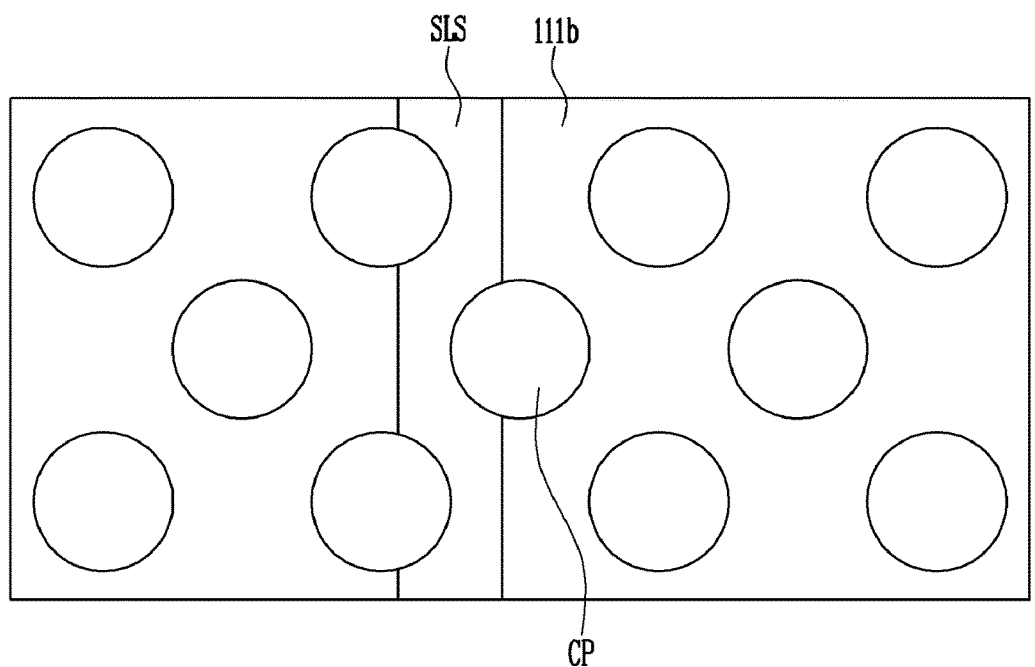

FIG. 10 corresponds to FIG. 2L, and FIG. 11 corresponds to FIG. 3L. The same descriptions as those of FIGS. 2L and 3L may be applied to the embodiment of FIGS. 10 and 11 other than the fact that a select line separation layer SLS' includes a sidewall covered with a conductive material pattern 120a. However, because not only the select line separation layer SLS' but also the conductive material pattern 120a is formed in the select line separation trench T1, the width of the select line separation layer SLS''' is less than that of the select line separation layer SLS described with reference to FIGS. 2K to 2L and 3K to 3L.

As such, the select line separation layer according to the first embodiments of the present disclosure may also include the sidewall covered with the conductive material pattern. This structure may reduce a difference in on/off characteristics between plugs CP, regardless of whether the plug is adjacent to the select line separation layer SLS' or is spaced apart from the select line separation layer SLS''', thus improving the operational reliability of the semiconductor memory device.

Figure 12:
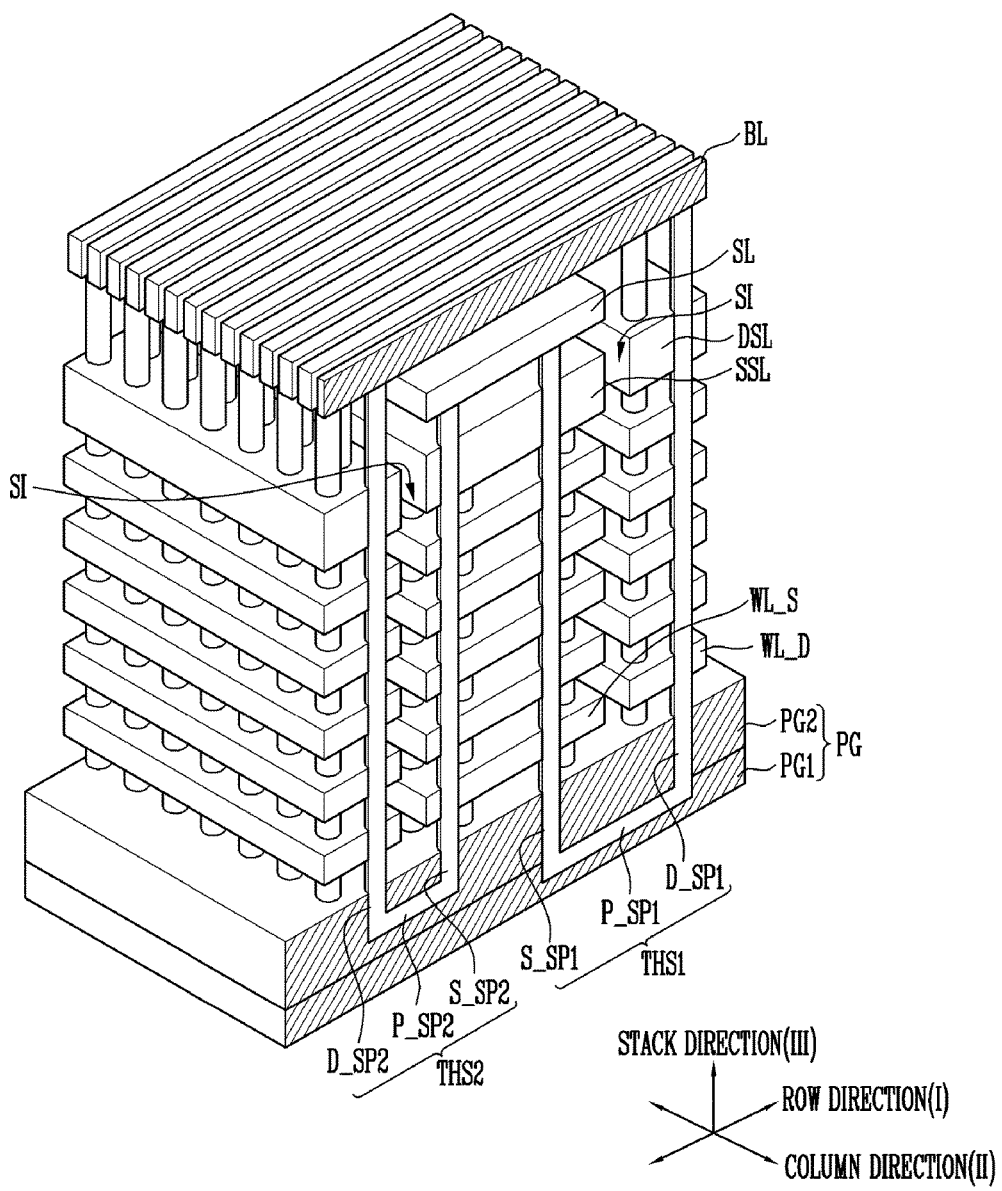
FIGS. 12 and 13 are views illustrating three-dimensional semiconductor memory devices according to embodiments of the present disclosure.
Figure 13:
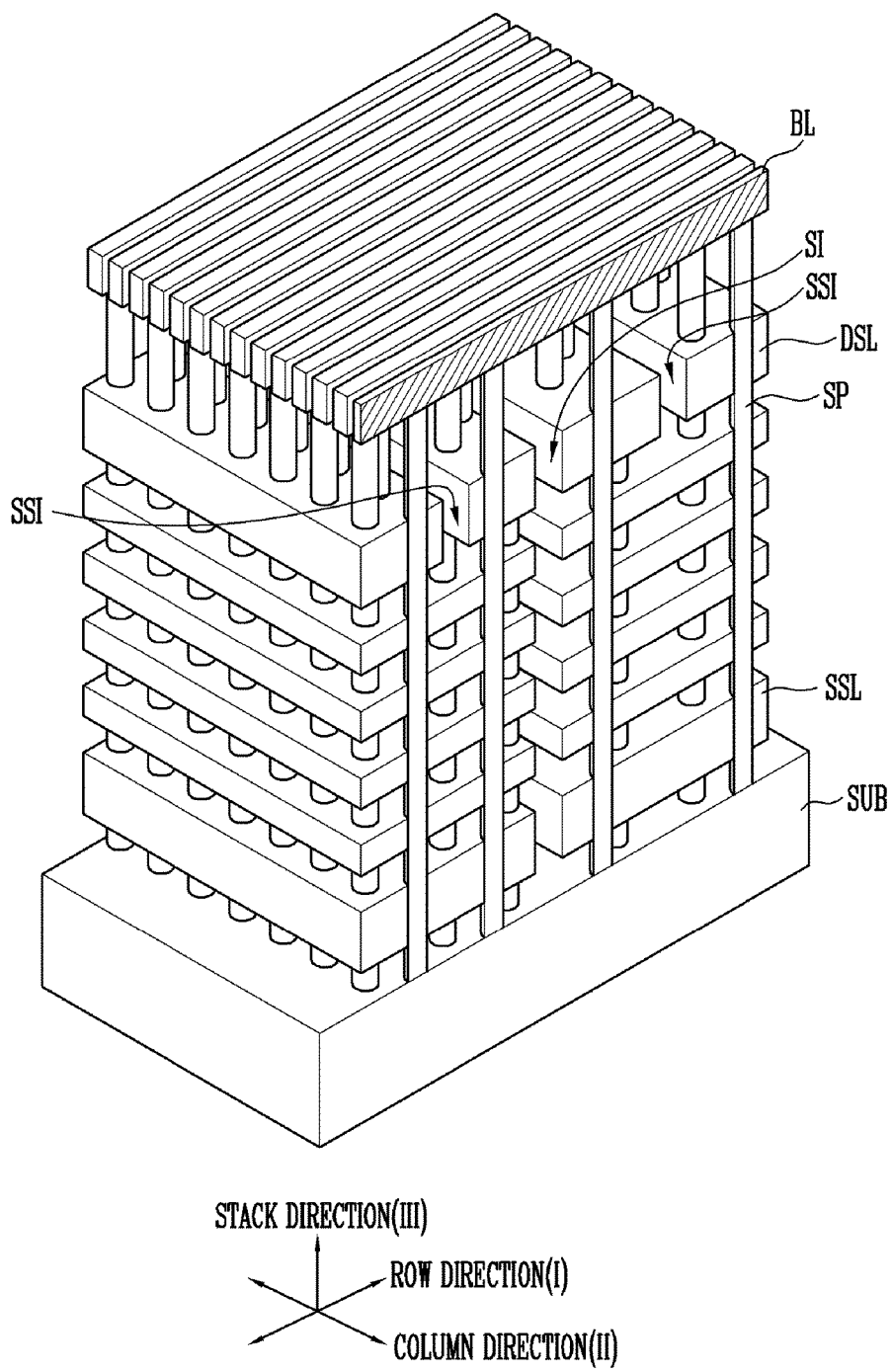

FIGS. 12 and 13 are views illustrating three-dimensional semiconductor memory devices according to an embodiment of the present disclosure.

FIG. 12 illustrates the case where memory cells are arranged along each of U-shaped through structures THS1 and THS2 and form a U-shaped memory string.

As illustrated in FIG. 12, the U-shaped through structures THS1 and THS2 may include a first through structure THS1 and a second through structure THS2.

The first through structure THS1 may include a first pipe structure P_SP1, and a first source side pillar structure S_SP1 and a first drain side pillar structure D_SP1 which protrude from the first pipe structure P_SP1. The first through structure THS1 may include a memory layer which forms outer surfaces of the first pipe structure P_SP1, the first source side pillar structure S_SP1 and the first drain side pillar structure D_SP1, and a channel layer which is enclosed by the memory layer and forms central portions of the first pipe structure P_SP1, the first source side pillar structure S_SP1 and the first drain side pillar structure D_SP1. Materials constituting the memory layer and the channel layer are the same as materials constituting the memory layer and the channel column described with reference to FIG. 1.

The second through structure THS2 may include a second pipe structure P_SP2, and a second source side pillar structure S_SP2 and a second drain side pillar structure D_SP2 which protrude from the second pipe structure P_SP2. The second through structure THS2 may include a memory layer which forms outer surfaces of the second pipe structure P_SP2, the second source side pillar structure S_SP2 and the second drain side pillar structure D_SP2, and a channel layer which is enclosed by the memory layer and forms central portions of the second pipe structure P_SP2, the second source side pillar structure S_SP2 and the second drain side pillar structure D_SP2. Materials constituting the memory layer and the channel layer are the same as materials constituting the memory layer and the channel column described with reference to FIG. 1.

The first and second pipe structures P_SP1 and P_SP2 are disposed on different planes, and the second pipe structure P_SP2 disposed on a relatively high plane may be shorter than the first pipe structure P_SP1. The first pipe structure P_SP1 and the second pipe structure P_SP2 may be alternately disposed in a row direction I and a column direction II. The first and second pipe structures P_SP1 and P_SP2 may be enclosed by a pipe gate PG. The pipe gate PG includes a first pipe gate PG1 enclosing the first pipe structure P_SP1, and a second pipe gate PG2 disposed on the first pipe gate PG1 and enclosing the second pipe structure P_SP2.

The first and second pipe structures P_SP1 and P_SP2 and the pipe gate PG may correspond to the lower structure described with reference to FIGS. 1 to 9C.

The first and second source side pillar structures S_SP1 and S_SP2 may be enclosed by a source side stack. The source side stack may include source side word lines WL_S and at least one source select line SSL disposed on the source side word lines WL_S. The first and second drain side pillar structures D_SP1 and D_SP2 may be enclosed by a drain side stack. The drain side stack may include drain side word lines WL_D and at least one drain select line DSL disposed on the drain side word lines WL_D. The source side stack and the drain side stack may be separated from each other by a slit SI. The first and second drain side pillar structures D_SP1 and D_SP2 are coupled to a bit line BL. The first and second source side pillar structures S_SP1 and S_SP2 are coupled to a source line SL.

The first and second source side pillar structures S_SP1 and S_SP2, and the first and second drain side pillar structures D_SP1 and D_SP2 may correspond to the plugs, the cell plugs and the select plugs described with reference to FIGS. 1 to 11.

The source side word lines WL_S, the source select line SSL, the drain side word lines WL_D and the drain select line DSL may correspond to the conductive line patterns described with reference to FIGS. 1 to 11. In particular, the source select line SSL and the drain select line DSL may correspond to the upper conductive line patterns described with reference to FIGS. 1 to 11.

In the structure illustrated in FIG. 12, a pipe transistor is formed at an intersection between the pipe gate PG and the first pipe structure P_SP1 or at an intersection between the pipe gate PG and the second pipe structure P_SP2. Drain side memory cells are formed at intersections between the drain side word lines WL_D and the first and second drain side pillar structures D_SP1 and D_SP2. Source side memory cells are formed at intersections between the source side word lines WL_S and the first and second source side pillar structures S_SP1 and S_SP2. Source select transistors are formed at intersections between the source select line SSL and the first and second source side pillar structures S_SP1 and S_SP2. Drain select transistors are formed at intersections between the drain select line DSL and the first and second drain side pillar structures D_SP1 and D_SP2. Consequently, the drain select transistor, the drain side memory cells, the pipe transistor, the source side memory cells and the source select transistor that are coupled in series along each of the first and second through structures THS1 and THS2 may form a U-shaped memory string. The U-shaped memory string is coupled between the bit line BL and the source line SL and forms a three-dimensional memory element.

FIG. 13 illustrates the case where memory cells are arranged along a straight string pillar SP and form a straight memory string.

As illustrated in FIG. 13, the straight string pillar SP is formed to come into contact with a substrate SUB including a source region. The string pillar SP may include a channel column and a memory layer enclosing an outer surface of the channel column, as described with reference to FIG. 1. The bit line BL may be coupled on the string pillar SP.

The substrate SUB including the source region may correspond to the lower structure described with reference to FIGS. 1 to 11.

The string pillar SP may be enclosed by at least one source select line SSL, word lines WL stacked on the source select line SSL, and a drain select line DSL stacked on the word lines WL. The source select line SSL, the word lines WL stacked on the source select line SSL, and the drain select line DSL stacked on the word line WL may be separated by the slit SI. The drain select line DSL may be divided into units smaller than that of the word lines WL by a slit SSI. The slit SSI may correspond to the select line separation trench described with reference to FIGS. 1 to 11.

The source select line SSL, the word lines WL and the drain select line DSL may correspond to the conductive line patterns described with reference to FIGS. 1 to 11. In particular, the drain select line DSL may correspond to the upper conductive line pattern described with reference to FIGS. 1 to 11.

In the structure illustrated in FIG. 13, a source select transistor is formed at an intersection between the source select line SSL and the string pillar SP. Memory cells are formed at intersections between the word lines WL and the string pillar SP. A drain select transistor is formed at an intersection between the drain select line DSL and the string pillar SP. In this way, the source select transistor, the memory cells and the drain select transistor that are coupled in series along the string pillar SP may form a straight memory string. The straight memory strings are arranged in a matrix form in the row direction I and the column direction II and form a three-dimensional memory element.

Figure 14:
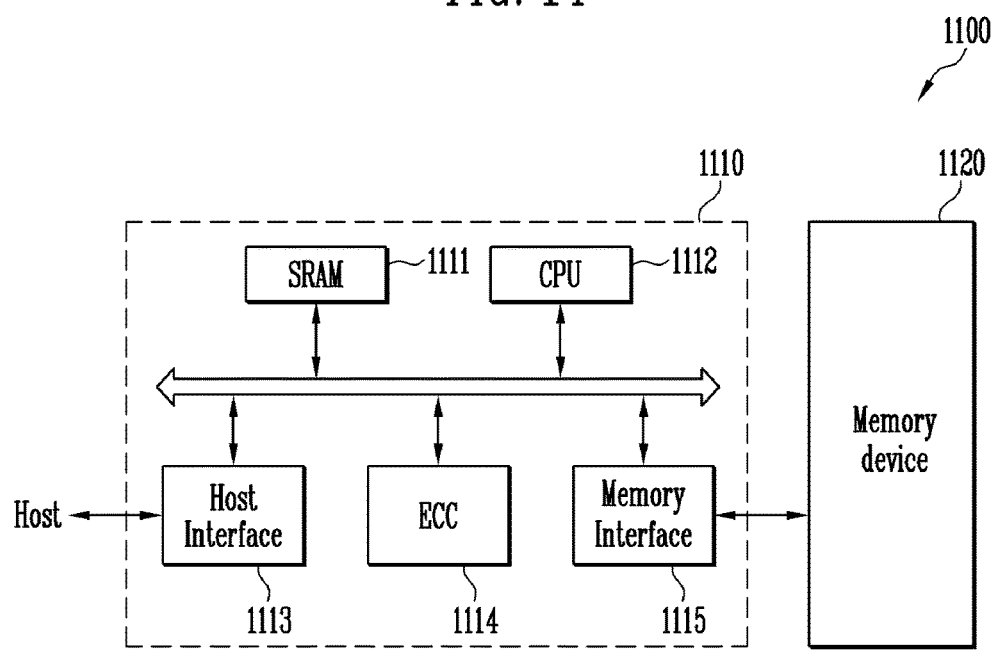
FIG. 14 is a block diagram illustrating the configuration of a memory system according to an embodiment of the present disclosure.

FIG. 14 is a block diagram illustrating the configuration of a memory system 1100 according to an embodiment of the present disclosure.

Referring FIG. 14, the memory system 1100 according to an embodiment of the present disclosure includes a memory element 1120 and a memory controller 1110.

The memory element 1120 may include the structure described with reference to FIGS. 1 to 11. For example, the memory element 1120 may include a waved select line separation layer which passes between the plugs arranged in a zigzag manner. In addition, the memory element 1120 may be a multi-chip package including a plurality of flash memory chips.

The memory controller 1110 is configured to control the memory element 1120, and may include a static random access memory (SRAM) 1111, a CPU 1112, a host interface 1113, an error correction code (ECC) 1114, and a memory interface 1115. The SRAM 1111 is used as an operation memory of the CPU 1112. The CPU 1112 performs general control operations for data exchange of the memory controller 1110. The host interface 1113 is provided with a data interchange protocol of a host coupled with the memory system 1100. Furthermore, the ECC 1114 detects and corrects an error included in the data that is read from the memory element 1120, and the memory interface 1115 interfaces with the memory element 1120. In addition, the memory controller 1110 may further include a read only memory (ROM) or the like that stores code data for interfacing with the host.

The above-described memory system 1100 may be a memory card or a solid state disk (SSD) equipped with the memory element 1120 and the controller 1110. For example, when the memory system 1100 is an SSD, the memory controller 1110 may communicate with an external device (e.g., a host) via one of various interface protocols, such as a universal serial bus (USB), a multimedia card (MMC), a peripheral component interconnection-express (PCI-E), a serial advanced technology attachment (SATA), a parallel advanced technology attachment (PATA), a small computer small interface (SCSI), an enhanced small disk interface (ESDI), and an integrated drive electronics (IDE).

Figure 15:
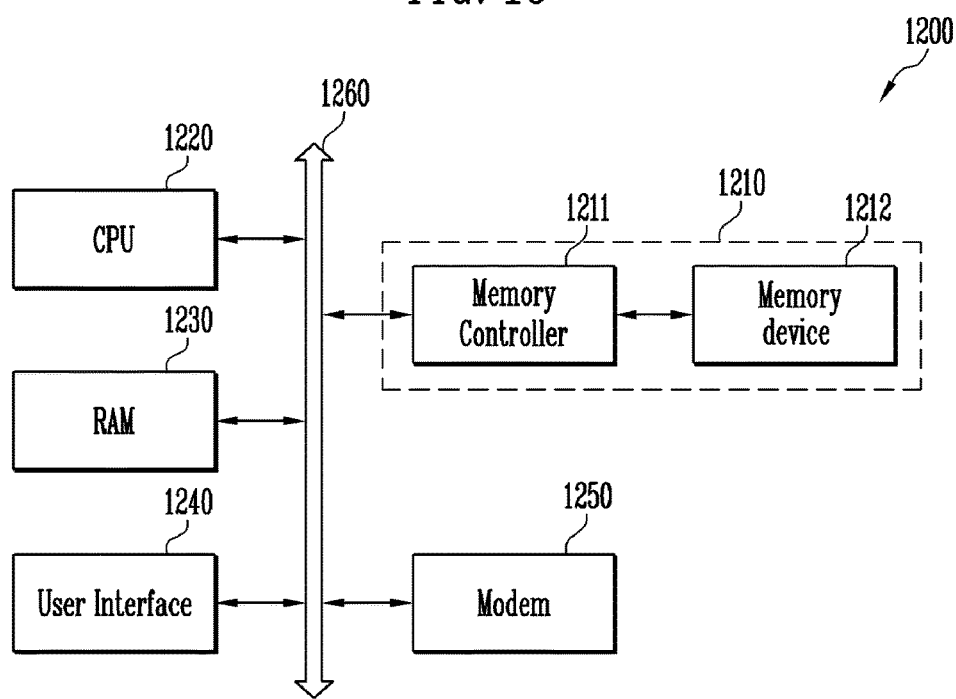
FIG. 15 is a block diagram illustrating the configuration of a computing system according to an embodiment of the present disclosure.

FIG. 15 is a block diagram illustrating the configuration of a computing system 1200 according to an embodiment of the present disclosure.

Referring to FIG. 15, the computing system 1200 in accordance with an embodiment of the present disclosure may include a CPU 1220, a random access memory (RAM) 1230, a user interface 1240, a modem 1250, and a memory system 1210 that are electrically coupled to a system bus 1260. Furthermore, if the computing system 1200 is a mobile device, it may further include a battery for supplying operating voltage to the computing system 1200. An application chip set, a camera image processor CIS, a mobile DRAM and the like may be further included.

As described above with reference to FIG. 14, the memory system 1210 may be configured with the memory element 1212 and the memory controller 1211.

Various embodiments of the present disclosure may provide a semiconductor device in which a select line separation layer may be efficiently formed without using a dummy cell plug.

Furthermore, even when the select line separation layer is designed to have a small critical dimension, the operational reliability of the semiconductor memory device may be ensured.

Examples of embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A semiconductor device comprising:
a lower stack;
a first upper stack disposed on the lower stack;
a second upper stack disposed on the lower stack, and spaced apart from the first upper stack by a select line separation trench;
first plugs configured to pass through the first upper stack and the lower stack, each of the first plugs including a sidewall protruding further into the select line separation trench than a sidewall of the first upper stack facing the select line separation trench to define a sidewall of the select line separation trench;
second plugs configured to pass through the second upper stack and the lower stack, each of the second plugs including a sidewall protruding further into the select line separation trench than a sidewall of the second upper stack facing the select line separation trench to define a sidewall of the select line separation trench; and
a select line separation layer formed along a contour of the protruded sidewalls of the first and second plugs in the select line separation trench.

2. The semiconductor device according to claim 1, wherein the select line separation layer has a wave structure.

3. The semiconductor device according to claim 1, wherein the first plugs and the second plugs are arranged in a zigzag manner in a first direction and a second direction, and
wherein the select line separation layer extends in any one direction of the first direction and the second direction and is disposed to overlap at least two plugs of the first plugs and the second plugs.

4. The semiconductor device according to claim 3, wherein the select line separation layer is disposed to overlap a portion of each of the at least two plugs.

5. The semiconductor device according to claim 4, wherein portions of the sidewalls of the first plugs and the second plugs come into contact with the conductive material pattern.

6. The semiconductor device according to claim 1, further comprising:
conductive material pattern formed on a sidewall of the select line separation layer.

7. A semiconductor device comprising:
a lower stack;
a first upper stack disposed on the lower stack;
a second upper stack disposed on the lower stack, and spaced apart from the first upper stack by a select line separation trench;
first plugs configured to pass through the first upper stack and the lower stack, each of the first plugs including a sidewall protruding further into the select line separation trench than a sidewall of the first upper stack facing the select line separation trench to define a sidewall of the select line separation trench;

second plugs configured to pass through the second upper stack and the lower stack, each of the second plugs including a sidewall protruding further into the select line separation trench than a sidewall of the second upper stack facing the select line separation trench to define a sidewall of the select line separation trench; and a select line separation layer disposed between the first upper stack and the second upper stack within the select line separation trench and formed to have a wave structure corresponding to a contour of the protruded sidewalls of the first and second plugs.

8. The semiconductor device according to claim 7, wherein the select line separation layer includes a sidewall covered with a conductive material pattern.

* * * * *